(12) United States Patent
Morikawa et al.

(10) Patent No.: US 7,873,087 B2
(45) Date of Patent: Jan. 18, 2011

(54) LIGHT SOURCE, LIGHT SOURCE DEVICE, LASER IMAGE FORMING DEVICE AND INTEGRATED CIRCUIT

(75) Inventors: Akihiro Morikawa, Osaka (JP);
Ken'ichi Kasazumi, Osaka (JP);
Tetsuro Mizushima, Osaka (JP);
Kazuhisa Yamamoto, Osaka (JP);
Shin-ichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 405 days.

(21) Appl. No.: 11/995,257

(22) PCT Filed: Jul. 11, 2006

(86) PCT No.: PCT/JP2006/313724

§ 371 (c)(1),
(2), (4) Date: Jan. 10, 2008

(87) PCT Pub. No.: WO2007/007733

PCT Pub. Date: Jan. 18, 2007

(65) Prior Publication Data

US 2009/0274182 A1    Nov. 5, 2009

(30) Foreign Application Priority Data

Jul. 11, 2005    (JP) .............................. 2005-201495

(51) Int. Cl.
*H01S 3/00* (2006.01)
(52) U.S. Cl. .............................. 372/38.02; 372/29.015; 372/34; 372/38.07
(58) Field of Classification Search .............. 372/38.02, 372/34, 29.015
See application file for complete search history.

(56) References Cited

U.S. PATENT DOCUMENTS

2004/0239818 A1    12/2004    Sugiyama et al.
2006/0159141 A1*    7/2006    Uchida et al. ................. 372/34

FOREIGN PATENT DOCUMENTS

| JP | 10-178229 | 6/1998 |
| JP | 10-178230 | 6/1998 |
| JP | 2000-315836 | 11/2000 |
| JP | 2000-349390 | 12/2000 |
| JP | 2002-319734 | 10/2002 |
| JP | 2004-214225 | 7/2004 |
| JP | 2004-279943 | 10/2004 |

OTHER PUBLICATIONS

International Search Report issued Sep. 26, 2006 in the International (PCT) Application No. PCT/JP2006/313724.
International Preliminary Report on Patentability issued Jun. 12, 2007 in the International (PCT) Application No. PCT/JP2006/313724.
Written Opinion of the ISA issued Sep. 15, 2006 in the International (PCT) Application No. PCT/JP2006/313724.

* cited by examiner

*Primary Examiner*—Dung T Nguyen
(74) *Attorney, Agent, or Firm*—Wenderoth, Lind & Ponack, L.L.P.

(57) ABSTRACT

The light sources according to the present invention include a laser oscillator including a semiconductor laser, a drive circuit for the semiconductor laser, an ACC circuit, an APC circuit, and a switch, and a starting drive current storage device, and is controlled in such a manner that the driving current at the start of the laser driving be always constant, and after the start of the lighting, it is switched to the APC operation to carry out the power control of the laser light output.

9 Claims, 17 Drawing Sheets

LIGHT SOURCE, LIGHT SOURCE DEVICE, LASER IMAGE FORMING DEVICE AND INTEGRATED CIRCUIT

BACKGROUND OF THE INVENTION

The present invention relates to a light source and a laser image forming device which uses the light source.

The outline constitution of a conventional laser image forming device is shown in FIG. 22.

The conventional laser image forming device 100 is intended to project a two-dimensional picture on a screen 158. The device 100 includes laser light sources 151a-151c, an expander optical system 152, an integrator optical system 153, collection lenses 159a-159c, mirrors 161a and 161c, field lenses 154a-154c, spatial optical modulators 155a-155c, a dichroic prism 156, and a projection lens 157.

Next, an operation of the conventional laser image forming device is described.

The lights respectively emitted from the laser light sources 151a-151c of RGB three colors (R: red, G: green, and B: blue) are subjected to light expansion by the expander optical system 152, respectively. In order to make the expanded lights of RGB three colors uniformly irradiated to the spatial optical modulator 155, those RGB three colors are subjected to beam formation by the integrator optical system 153 which comprises a lens and a small lens array. The respective RGB three colors which have been subjected to beam formation are subjected to intensity modulation dependent on the respective input image signals by spatial optical modulators, and then synthesized with together by the dichroic prism 156. The intensity modulated and synthesized lights are enlarged by the projection lens 157 and, displayed on the screen 158 as a two-dimensional image. With the laser image forming device of such construction, since the lights of respective RGB light sources are monochromatic, high color purity and vivid image display is enabled by using appropriate wavelength laser sources.

By the way, with such conventional laser image forming device, in order to realize a beautiful picture in a good white balance for a long period of time, a method that can realize lengthening of a lifetime of a laser light source, stabilization of power, and can keep the power balance in the light outputs of RGB lasers constant is required.

Therefore, in the conventional method of controlling a semiconductor laser, as described in patent document 1, patent document 2, and patent document 3, it is proposed to combine the constant optical power output control (called as automatic power control: APC) and constant current control (called as automatic current control: ACC) to provide a method that can prevent the destruction of the semiconductor laser and lengthen the lifetime of the semiconductor laser.

Moreover, a method of constituting a laser light source of one color by plural laser sources and operating the same below normal power, thereby attempting lengthening the lifetime (patent document 4), and a method of interrupting a current injection for faulted light sources and taking a light output balance by using remaining laser light sources (patent documents 5) are proposed.

Furthermore, as disclosed in patent document 6, a method of detecting a long-term output reduction and lowering the set value of the output control means thereby to increase the lifetime of the semiconductor laser is proposed.

[Patent document 1] Japanese published patent application Hei. 10-178229

[Patent document 2] Japanese published patent application Hei. 10-178230

[Patent document 3] Japanese published patent application 2000-349390

[Patent document 4] Japanese published patent application 2004-214225

[Patent document 5] Japanese published patent application 2004-279943

[Patent document 6] Japanese published patent application 2002-319734

SUMMARY OF THE INVENTION

Though the control methods of the semiconductor laser shown in patent documents 1, 2, and 3 carry out the switching of ACC and APC with respect to current values of certain references, with considering the deterioration of lasers over a long period of use, that is, the change in the current value required for continuously obtaining the same output for a long period of time, it is required to raise the driving current value a little by a little in order to keep a constant power output. Therefore, even when an APC is applied, the load that is applied to the semiconductor laser varies depending on the setting of the switching reference values for APC and ACC. That is, while if the current value as a reference value for ACC switching is set to a low value, since a large current value is not flowed in APC, a further lengthening of a lifetime is possible, if the reference value for ACC switching is set to a high value, the allowable range for the current value for performing APC is widened, being disadvantageous in lengthening the lifetime with relative to the case where the reference value is set to a low value. Furthermore, since there are variations in the characteristics of the individual semiconductor lasers, it is not possible to easily determine the reference values as references for judging whether the light sources are deteriorated or not in the stand point of lengthening the lifetime of the lasers. Such a problem cannot be solved even with the methods disclosed in the patent documents 4 and 5.

Moreover, while the method of lowering the set value for the control means in order to realize lengthening of the lifetime is disclosed in patent document 6, it is required to provide a means for detecting the output reduction, and the load which would be applied to the semiconductor laser would be varied depending on whether the setting of the reference value is made high or low.

The present invention is directed to solving the above-mentioned problems, and it is an object of the present invention to provide a light source that can realize lengthening of the lifetime. It is a further object of the present invention to provide a light source device that can realize the lengthening of the lifetime of the light sources, and can always keep the power balance between the light outputs of the light sources. It is yet a further object of the present invention to provide a laser image forming device that can realize the lengthening of the lifetime of the light sources, and can always provide a beautiful picture without color deviations even when the output power of the laser light sources is reduced. It is a still further object of the present invention to provide an integrated circuit that can realize the lengthening of the lifetime of the light sources.

In order to solve the above-described objects, a light source according to a first aspect of the present invention comprises a light source having a laser oscillator and a starting drive current storage device for storing a starting drive current value, and the laser oscillator initiating a first time light emission with a predetermined starting drive current which is stored in the starting drive current storing device, and a constant light output control for the laser oscillator being carried out during the period from the start of lighting to the un-lighting. Further, the laser oscillator initiates a second or later time light emission with a starting drive current of the same value as the first time light emission which is stored in the starting drive current storing device, and a constant light output control for the laser oscillator is carried out during the period from the start of lighting to the un-lighting.

A light source according to a second aspect of the present invention is characterized in that it comprises a light source according to the first aspect, wherein the starting drive current is varied dependent on the temperature of the laser oscillator.

A light source according to a third aspect of the present invention is characterized in that it comprises a light source according to the second aspect, including a temperature control circuit which controls the temperature of the laser oscillator, the temperature control circuit controlling so that the temperature of the laser oscillator becomes a predetermined temperature, and the laser oscillator initiating a light emission with a starting drive current corresponding to the predetermined temperature which is stored in the starting drive current storing device.

A light source according to a fourth aspect of the present invention is characterized in that it comprises a light source according to the first aspect, wherein the constant light output control is carried out in such a manner that a predetermined current value is provided, and the constant light output control is halted when the driving current of the laser oscillator has reached the predetermined current value.

A light source according to a fifth aspect of the present invention is characterized in that it comprises a light source according to the first aspect, wherein the constant light output control is carried out in such a manner that a predetermined temperature value is provided, and the constant light output control is halted when the temperature of the laser oscillator has reached the predetermined temperature value.

A light source device according to a sixth aspect of the present invention is characterized in that it comprises more than two light sources each comprising a laser oscillator and a starting drive current storage device for storing a starting drive current for the laser oscillator, the laser oscillators having different wavelengths, respectively, a power balancing storage device for storing the output ratio value between the lights from the more than two light sources having different wavelengths, an optical power detector for detecting the optical powers of the more than two light sources having different wavelengths, respectively, and the light source device performing a constant light output control in such a manner that more than two light sources having different wavelengths initiate light emissions with the starting drive currents, respectively, the light outputs from the respective light sources are detected by the photo detector, and the driving currents of the respective light sources are varied so that the ratio between the outputs from the respective light sources becomes equal to the output ratio that is stored in the power balancing storage device, thereby the more than two light sources having different wavelengths are controlled under a constant output control.

A light source device according to a seventh aspect of the present invention is characterized in that it comprises more than two light sources each comprising a laser oscillator and a starting drive current storage device for storing a starting drive current value for the laser oscillator, the laser oscillators having different wavelengths, respectively; a power balancing storage device for storing the output ratio value between the lights from the more than two light sources having different wavelengths; an optical detector for detecting the optical powers of the more than two light sources having different wavelengths, respectively; and the light source device performing a constant light output control in such a manner that the more than two light sources having different wavelengths initiate light emissions with the starting drive currents, respectively, the light outputs from the respective light sources are detected by the photo detector, the driving currents of the respective light sources are varied so that the ratio between the outputs from the respective light sources becomes equal to the output ratio value that is stored in the power balancing storage device, and after the output ratio is reached, one among the more than two light sources having different wavelengths is controlled under a constant current control, while the other remaining light sources are controlled under constant output control.

A light source device according to an eight aspect of the present invention is characterized in being the light source device according to the seventh aspect, wherein the light source performing the constant current control is a light source having the largest reduction ratio relative to the above-mentioned output ratio.

A light source device according a ninth aspect of the present invention is characterized in being the light source device according to the eighth aspect, wherein the light sources other than the light source having the largest reduction ratio among the more than two light sources is controlled to be driven while maintaining the above-mentioned output ratio, with following the output power of the light source having the largest reduction ratio.

A light source device according to a tenth aspect of the present invention is characterized in that the light source device comprises more than two light sources having different frequencies, and a power balancing storage device for storing the output ratio between the lights outputted from the more than two light sources having different wavelengths, the first light source among the more than two light sources having different wavelengths comprises a laser oscillator and a starting drive current storage device for storing the starting drive current for the laser oscillator, and is operated to start light emission with a starting drive current which is stored in the starting drive current storage device and then to perform a constant light output control, and the light sources other than the first light source are controlled under a constant light output control while maintaining the above-described output ratio, with following the output power of the first light source.

A light source device according an eleventh aspect of the present invention is characterized in that the light source device comprises more than two light sources having different wavelengths, the first light source among the more than two light sources having different wavelengths performs the constant current control, and the light sources other than the first light source carry out constant light output control based on the light output of the first light source after the light emission of the first light source is performed.

A light source device according a twelfth aspect of the present invention is characterized in being the light source device according to the eleventh aspect, which comprises a power balancing storage device which stores the output ratio between the light outputs from the more than two light sources having different wavelengths, the light source having the largest light output reduction rate among the more than two light sources having different wavelengths is made as the first light source, and the light source other than the first light source is controlled to be driven while keeping the above-mentioned output ratio, with following the output power of the first light source.

A laser image forming device according a thirteenth aspect of the present invention is characterized in comprising:

employing the light source device according to one of the previously described first to fifth and sixth to twelfth aspects as at least more than two laser light sources, spatially modulating the output lights from the at least more than two light sources by the spatial light modulation elements, and thereby projecting the spatially modulated lights onto the screen.

A laser image forming device according to a fourteenth aspect of the present invention is characterized in being the laser image forming device according to the thirteenth aspect, wherein the more than two laser sources comprise RGB three color laser sources.

A laser image forming device according a fifteenth aspect of the present invention is characterized in being the laser image forming device according to the fourteen aspect, wherein when the output of the one of the RGB three laser light sources is changed, the light outputs from the remaining two laser lights are controlled with following the change in output power of the one laser light source thereby to take a white balancing.

A laser image forming device according to a sixteenth aspect of the present invention is characterized in being the laser image forming device according to the fourteen aspect, wherein when the wavelength of the one of the RGB three laser light sources is changed, the light outputs from the remaining two laser lights are controlled with following the change in the wavelength of the one laser light source thereby to take a white balancing.

An integrated circuit according a seventeenth aspect of the present invention is characterized in being an integrated circuit for driving and controlling light sources, wherein, the light source is initiated with a light emission with a predetermined starting drive current, and after the light emission, a constant light output control after the light emission is started.

An integrated circuit according an eighteenth aspect of the present invention is characterized in being an integrated circuit for driving and controlling more than two light sources having different wavelengths, wherein light emissions by the light sources are initiated with predetermined starting drive currents, the light outputs of the respective light sources are detected after the light emissions are started, the driving current values of the respective light sources are varied so that the detected light outputs of the respective light sources have a predetermined output ratio between them, thereby carrying out constant light output controls for the respective more than two light sources.

An integrated circuit according a nineteenth aspect of the present invention is characterized in being an integrated circuit for driving and controlling more than two light sources having different wavelengths, wherein initiating light emissions by the more than two light sources are initiated with predetermined starting drive currents, the light outputs of the respective light sources are detected after the light emissions are started, the driving current values of the respective light sources are varied so that the detected light outputs of the respective light sources have a predetermined output ratio between them, and thereby carrying out a constant current control for one of the light sources and constant light output controls for the remaining light sources.

An integrated circuit according a twentieth aspect of the present invention is characterized in being an integrated circuit for driving and controlling more than two light sources having different wavelengths, wherein a first light source among the more than two light sources is controlled under a constant current control, and the light sources other than the first light source are controlled on the basis of the light output of the first light source after the light emission by the first light source is occurred.

According to a light source of the present invention, since the light source includes a laser oscillator and a starting drive current value storage device, and a first time light emission by the laser oscillator is initiated with a predetermined starting drive current that is stored in the starting drive current value memory storage, a constant light output control is carried out during the period from the start of lighting to the un-lighting, further, initiating a second or later time light emission by the laser oscillator is initiated with a starting drive current of the same value as the first time light emission which is stored in the starting drive current storing device, and a constant light output control is carried out during the period from the start of lighting to the un-lighting, the lifetime of the laser light source can be lengthened without employing the detector for detecting a long-term deterioration.

According to a light source device of the present invention, since the light source device includes more than two light sources having different wavelengths, each light source comprising a laser oscillator and a starting drive current value memory storage for storing the starting drive current value for the laser oscillator, a power balance memory storage for storing the ratio between the light outputs from the more than two light sources having different wavelengths, and an optical detector for detecting light outputs from the more than two light sources having different wavelengths, and the light source device is operated in such a manner that lights are emitted from the more than two light sources having different wavelengths with the starting drive current values, respectively, the light outputs from the respective light sources are detected by the photo detector, the driving current values of the respective light sources are varied so that the ratio between the light outputs from the respective light sources becomes equal to the output ratio stored in the power balance value memory storage, and then the constant light output control is carried out for the more than two light sources having different wavelengths. Thus, the control of the outputs of the respective light sources can be carried out so that the output ratio becomes always constant, and thereby it is possible to always obtain beautiful images of no color shift even when the laser power is changed.

According to a light source device of the present invention, since the light source device includes more than two light sources having different wavelengths, each light source comprising a laser oscillator and a starting drive current value memory storage for storing the starting drive current for the laser oscillator, a power balance memory storage for storing the ratio between the light outputs from the more than two light sources having different wavelengths, and an optical detector for detecting light outputs from the more than two light sources having different wavelengths, and the light source device is operated in such a manner that lights are emitted from the more than two light sources having different wavelengths with the starting derive current values, respectively, the light outputs from the respective light sources are detected by the photo detector, the driving current values of the respective light sources are varied so that the ratio between the outputs from the respective light sources becomes equal to the output ratio stored in the power balance memory storage, and after the output ratio is reached, a constant current control is carried for one of the light source among the more than two light sources while constant output controls are carried out for the remaining light sources. Thus, the control of the outputs of the respective light sources can be carried out so that the output ratio becomes always constant, and thereby it is possible to always obtain beautiful images of no color shift even when the laser power is changed.

According to a light source device of the present invention, since the light source device comprises more than two light sources having different frequencies and a power balance memory storage for storing the output ratio between the lights outputted from the more than two light sources having different wavelengths, the first light source among the more than two light sources having different wavelengths comprises a laser oscillator and a starting drive current storage device for storing the starting drive current for the laser oscillator, and is operated to start light emission with a starting drive current which is stored in the starting drive current storage device and then to perform a constant light output control, and the light sources other than the first light source are controlled under a constant light output control while maintaining the above-described output ratio, with following the output power of the first light source, a white balancing can be taken with controlling the outputs of the remaining light sources on the basis of one of the light sources, and thereby beautiful images with no color shift can be always obtained.

According to a light source device of the present invention, since a light source device comprising more than two light sources having different wavelengths; the first light source among the more than two light sources having different wavelengths performing a constant current control; and the light sources other than the first light source carrying out constant light output control based on the light output from the first light source after the light emission by the first light source is performed, when red laser which is likely to be deteriorated with relative to green laser and blue laser is made the first laser source, the rise of the driving current during the light emission of the red laser can be suppressed, thereby lengthening the lifetime of the red laser, as well as lengthening the lifetime of the whole light source device.

According to a laser image forming device of the present invention, since the laser image forming device comprises employing a light source device according to one of Claims 1 to 5 and 6 to 12 as at least more than two laser light sources, and spatially modulating the output lights from the at least more than two light sources by the spatial light modulation elements, and thereby to project the spatially modulated lights onto the screen, it is possible to take white balancing for respective laser sources, and to provide images of no color shift.

DESCRIPTION OF REFERENCE NUMERALS

Figure 1:
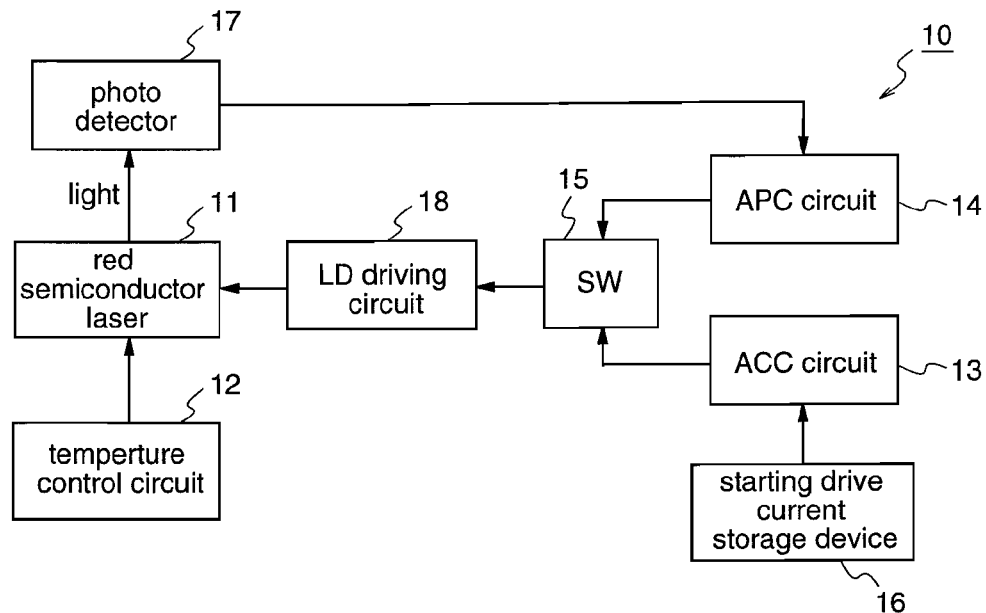
FIG. 1 is a schematic diagram illustrating a light source according to a first embodiment of the present invention.

11, 21, 31*a*, 41*a*, 51*a* . . . red semiconductor laser
61*a*, 71*a* . . . red laser
31*b*, 41*b*, 51*b*, 61*b* . . . green laser
31*c*, 41*c*, 51*c*, 61*c* . . . blue laser
12, 32*a*-32*b*, 42*a*-42*b*, 52*a*-52*c*, 62*a*-62*c* and 72*a*-72*c* . . . temperature control circuit
22 . . . temperature measurement unit
13, 23, 33*a*, 43*a*, 53*a*, 63*a*-63*c* and 73*a*-73*c* . . . ACC circuit
14, 24, 34*a*-34*c*, 44*a*-44*c*, 54*b*-54*c*, 64*a*-64*b* and 74*a*-74*c* . . . APC circuit
15, 25, 35*a*, 45*a*, 65*a*-65*c* and 75*a*-75*c* . . . switch (SW)
16, 26, 36*a*, 46*a*, 56*a*, 66*a*-66*c* and 76*a*-76*c* . . . starting drive current storage device
17, 27, 37*a*-37*c*, 47*a*-47*c*, 57*a*-57*c*, 67*a*-67*c* and 77*a*-77*c* . . . photo detector
18, 28, 38*a*-38*c*, 48*a*-48*c*, 58*a*-58*c*, 68*a*-68*c* and 78*a*-78*c* . . . LD drive circuit
39, 49, 59, 69 and 79 . . . power balance memory storage
100 . . . laser image forming device
150 . . . vibrating motor
151*a* . . . red laser light source
151*b* . . . green laser light source 151c . . . blue laser light source
152 . . . expander optical system
153 . . . integrator optical system
154a, 154b and 154c . . . field lens
155a, 155b and 155c . . . spatial optical modulator
156 . . . dichroic prism
157 . . . projection lens
158 . . . screen
159a, 159b and 159c . . . condenser lens
161a and 161c . . . mirror

DETAILED DESCRIPTION OF THE INVENTION

Hereinafter, embodiments of the present invention will be described with reference to the drawings.

First Embodiment

Hereinafter, a light source according to a first embodiment of the present invention will be described with reference to the drawings.

The light source according to the first embodiment of the present invention is intended to realize lengthening of the lifetimes of lasers by employing a control method that has combined an APC operation and an ACC operation for a laser light source of a single wavelength.

FIG. 1 is a schematic diagram illustrating a light source according to a first embodiment of the present invention.

The light source 10 shown in FIG. 1 is equipped with a laser oscillator having a semiconductor laser 11, a driving circuit 18 for the semiconductor laser 11, an ACC circuit 13, an APC circuit 14, and a switch 15, and a starting drive current storage device 16. While an example that is provided with the ACC circuit 13 is described, this ACC circuit 13 may not be necessarily equipped. In this case, the output of the starting drive current storage device 16 is connected to the switch 15.

The laser oscillator switches between the ACC circuit 13 and the APC circuit 14 by the switch (SW) 15, to carry out an automatic current control (ACC) or an automatic power control (APC).

The semiconductor laser 11 emits red laser light of wavelength 630 nm. This semiconductor laser 11 is controlled for its temperature by using the temperature control circuit 12. In addition, the output power of the semiconductor laser 11 is detected by the photo detector 17.

The starting drive current storage device 16 controls the starting drive current at constant. Thus, in this first embodiment, the laser drive is started with always making the starting current value at constant.

Figure 2:
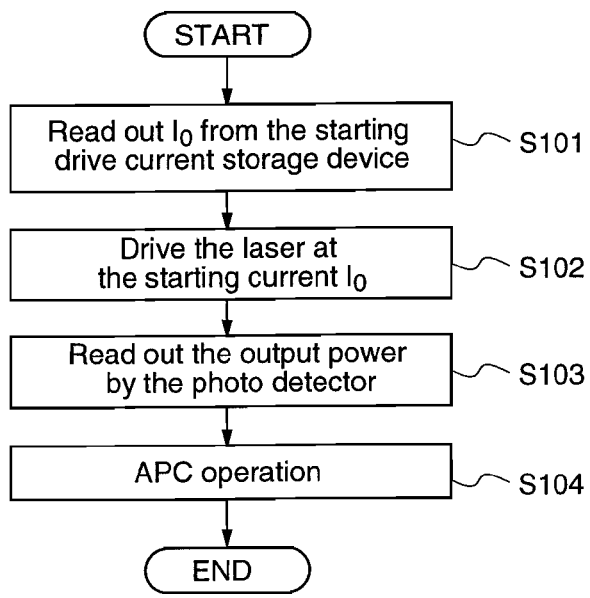
FIG. 2 is a diagram for explaining the algorithm of the power control method in the light source according to the first embodiment of the present invention.

Next, the power control method will be described. FIG. 2 shows the algorithm of the power control method in the light source according to the first embodiment.

First of all, the starting current value $I_0$ stored in the starting drive current storage device 16 is read out (Step S101), and the red semiconductor laser 11 is laser driven at this starting current value $I_0$ (Step S102). Then, the red semiconductor laser 11 performs an ACC operation.

The output of the red semiconductor laser 11 which has started the lighting with the starting drive current value $I_0$ is read out by the photo detector 17 (Step S103), the light source 10 is switched to the APC operation, and thereby it carries out such a power control that the output power of the red semiconductor laser 11 be constant (Step S104).

Such power control of this first embodiment that has combined the ACC operation and the APC operation is different from the conventional APC operation or the conventional power control that has combined the APC operation and the ACC operation.

That is, in the conventional power control method, when an APC operation is performed, the laser power immediately before the laser is un-lightened and the driving current then are memorized after the conclusion of the laser lighting, and the stored values are reflected at the start of laser lightening at next time. On the other hand, in the power control method of the first embodiment, while the switching from the ACC operation to the APC operation is carried out after the start of the laser lighting, the current value at the start of the laser lighting is controlled to be always constant. This will be described in detail in the following.

Figure 3:
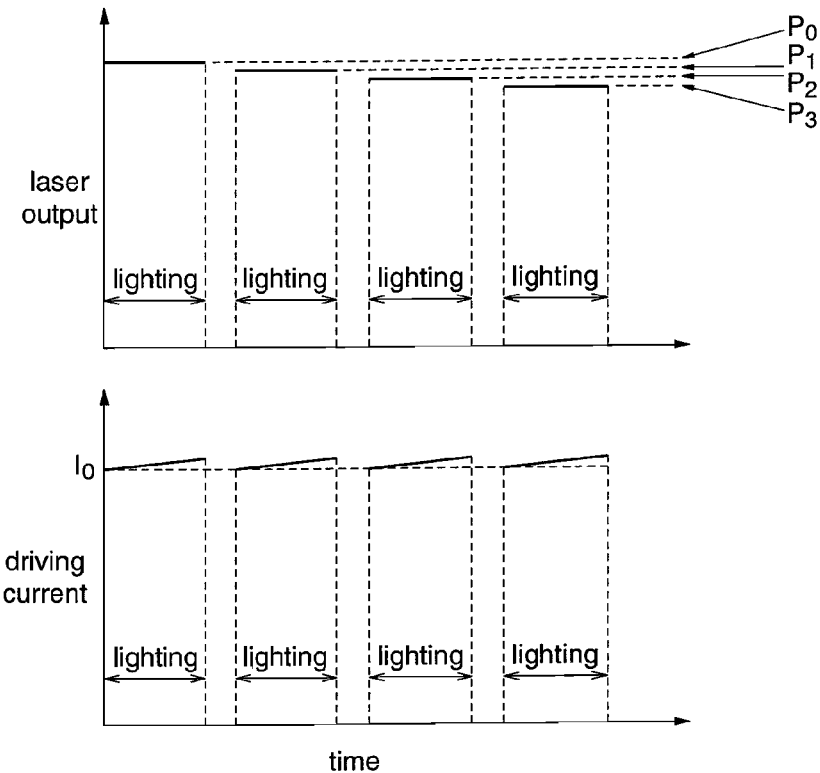
FIG. 3 is a diagram for explaining the time characteristics of the laser driving current and the laser output in the first embodiment of the present invention.

FIG. 3 shows a relationship between the laser output versus time and a relationship between driving current value and time in the light source 10 of the first embodiment.

At the initial lighting, since the APC operation is carried out after the start of the lighting, the power is always kept at the same power until the next un-lighting. On the other hand, while as for the driving current value, the lighting is started with the starting current value $I_0$ that is stored at the starting drive current storage device 16, the driving current value rises up little by little because the laser deterioration occurs during the use over a long term.

At the time of re-lighting after once un-lighting is performed, the lighting is started with the driving current value $I_0$ that is stored in the starting drive current storage device 16 similarly as the previous time, and then it is switched to the APC operation. Also in this case, while the power is always kept at the same power until the next un-lighting, the driving current value rises up little by little.

In this way, the light source 10 of the first embodiment is controlled in such a manner that the starting current value at the lighting be always constant while the power during the lighting be constant after the start of lighting by the APC operation in cases where the temperature control of the semiconductor laser is performed. Thus, it is possible to prevent, though there might be a power reduction due to a long-term deterioration, from applying a large load to the lasers, thereby realizing lengthening of lifetimes of lasers.

Figure 4:
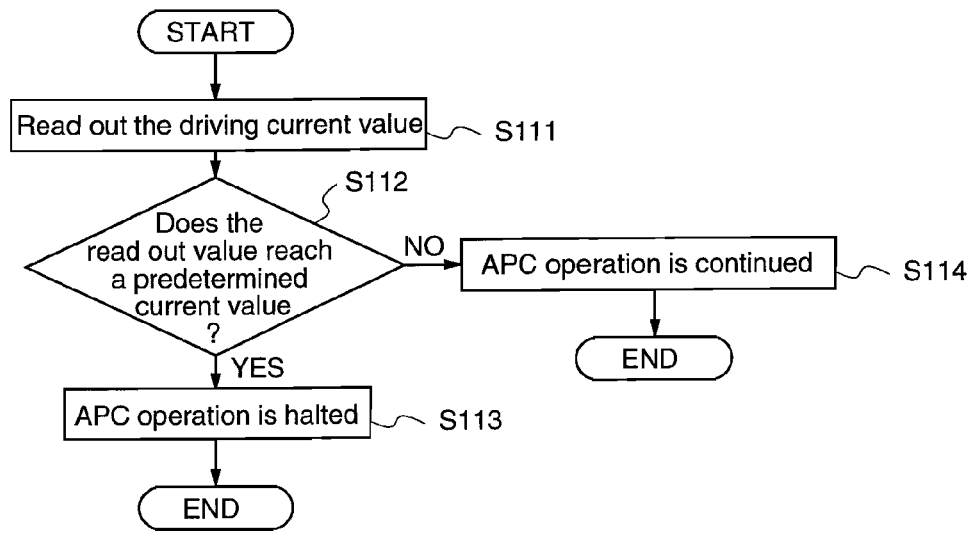
FIG. 4 is a diagram illustrating a control method for halting the APC operation.

Though in the first embodiment the setting of the upper limit for the driving current during the period from the start of lighting to the un-lighting is not carried out in the APC circuit, the setting of the upper limit for this driving current is preferably carried out so as to provide for rapid laser deterioration during the APC operation. A flowchart in this case is shown in FIG. 4. First of all, the driving current value of the semiconductor laser 11 is read out (Step S111), it is judged as to whether the read out value has reached the predetermined current value or not (Step S112), and when it has reached, the APC operation is halted (Step S113), while when it has not yet reached, the APC operation is continued (Step S114). Thereby, it is possible to prevent a great increase from occurring in the driving current that occurs with following the rapid deterioration of the laser during the APC operation. In addition, when the upper limit driving current value is reached, it is preferred that the control is switched from the APC operation to the ACC operation.

Figure 5:
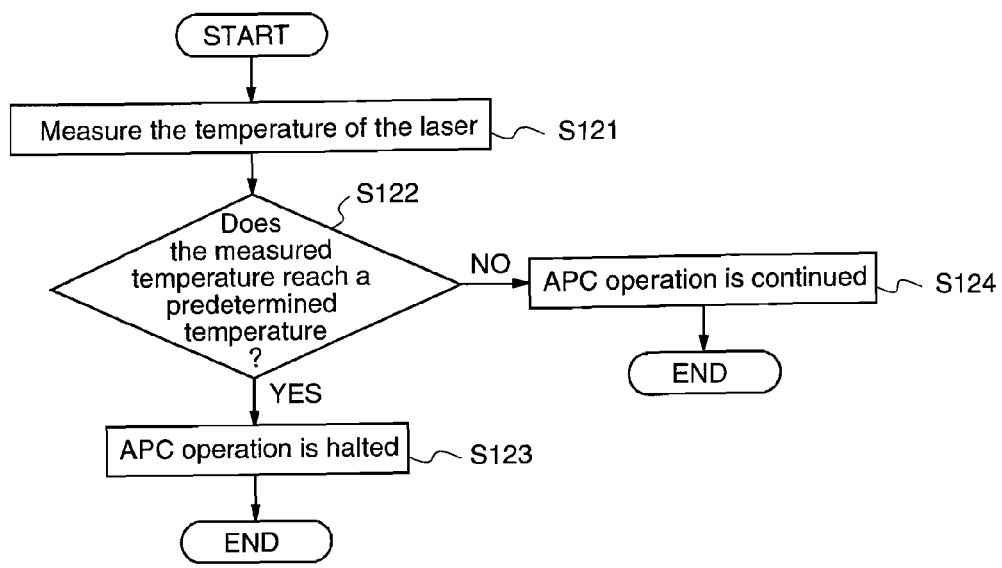
FIG. 5 is a diagram illustrating another control method for halting the APC operation.

While in the first embodiment the temperature control of the laser chip is carried out, when a rapid temperature rise occurs due to runaway of the temperature control circuit 12, there is a large possibility that a large current flows in the APC operation. Therefore, it is preferable that there may be provided an upper limit temperature for the laser chip. A flowchart in this case is shown in FIG. 5. First of all, the temperature of the semiconductor laser 11 is measured (Step S121), and it is judged as to whether the measured temperature has reached the predetermined temperature value or not (Step S122), and when it has reached, the APC operation is halted (Step S123), while it has not yet reached, the APC operation is continued (Step S124). In this way, by providing such a control method that the upper limit temperature for the semiconductor laser 11 is set and when the temperature of the semiconductor laser 11 has reached the set temperature, it is switched from the APC operation to the ACC operation, it is possible to prevent from occurrences of sudden destruction of lasers. Here, when the algorithm for changing the control of the upper drive current is included, it is not limited to the above. Since the high temperature of the laser medium may have a factor of shortening of the laser lifetime, it is more desirable to set the upper limit temperature for the laser even when there is an upper limit for the driving current.

While in the above first embodiment, a one-chip semiconductor laser light source is supposed as a single wavelength laser light source, a plural-chip semiconductor light source, or a multi-stripe semiconductor laser light source may be employed with the similar control methods being carried out.

Second Embodiment

A light source according to a second embodiment of the present invention will be described.

The light source of this second embodiment is intended to realize lengthening of the laser lifetime by using the control method that has combined the APC operation and the ACC operation for the single wavelength laser light source. Here, it is supposed that the temperature control of the red semiconductor laser of wavelength 630 mm is not performed.

Figure 6:
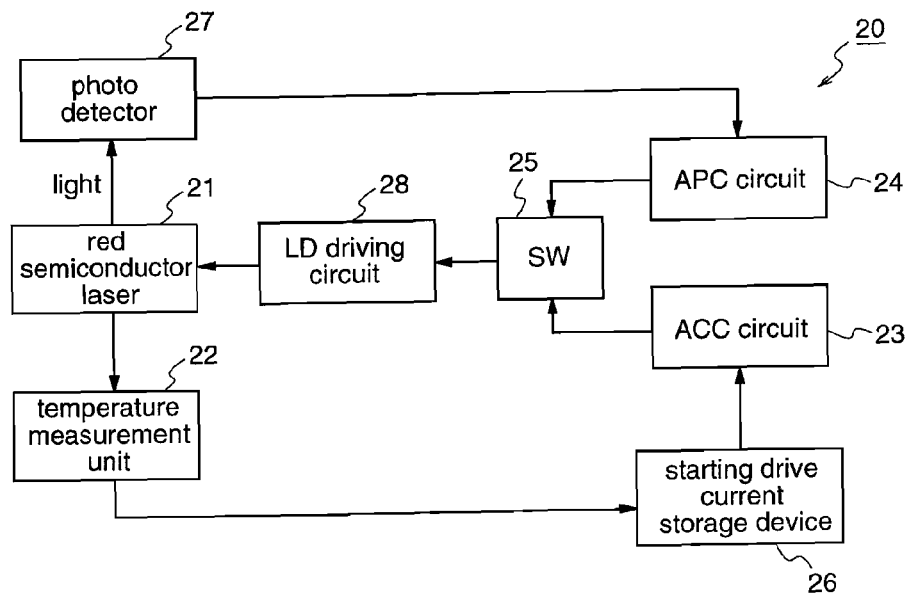
FIG. 6 is a schematic diagram illustrating a light source according to a second embodiment of the present invention.

FIG. 6 is a schematic construction diagram illustrating a light source according to the second embodiment of the present invention.

The light source 20 shown in FIG. 6 is equipped with a laser oscillator having a semiconductor laser 21, a driving circuit 28 for the semiconductor laser, an ACC circuit 23, an APC circuit 24, and a switch 25, and a starting drive current storage device 26. While an example that is provided with the ACC circuit 23 is described, this ACC circuit 23 may not be necessarily equipped. In this case, the output of the starting drive current storage device 26 is connected to the switch 25.

The laser oscillator switches between the ACC circuit 23 and the APC circuit 24 by the switch (SW) 25, to carry out an automatic current control (ACC) or an automatic power control (APC).

The semiconductor laser 21 emits red laser light of wavelength of 630 nm. The temperature of this semiconductor laser 21 is measured using temperature measurement unit 22. Moreover, the output power of this semiconductor laser 21 is detected by the photo power detector 27.

The starting drive current storage device 26 has a temperature versus current value conversion table (not shown), and controls driving current based on the temperature of the semiconductor laser 21.

Here, the difference between the light source 20 of the second embodiment and the light source 10 of the first embodiment will be described.

Since in the light source 10 of the first embodiment the temperature control is performed so that the temperature of the laser chip may always be constant, it is always driven with the start current value $I_0$ determined by the starting drive current storage device 16 at the time of start of laser lighting.

On the other hand, since in the light source 20 of the second embodiment the temperature control of the semiconductor laser 21 is not performed, the current value at start of lighting is determined dependent on the temperature of the semiconductor laser 21. This algorithm will be described with reference to FIG. 7.

First, the temperature and the driving current value $I_0$ at the start of lighting is learned, and thereafter, the control is carried out so that the light output becomes constant until the laser is un-lightened.

At the next start of lighting, the temperature of the semiconductor laser 21 is measured (Step S201), and the drive current $I_0'$ is determined from the temperature versus current value conversion table that is stored in the starting drive current storage device 26 (Step S202). The red semiconductor laser 21 is laser driven with the red semiconductor laser 21 (at step S203), and the light source 20 is switched to the APC operation to perform a power control so that the output power of the red semiconductor laser 21 is constant (Step S204).

Figure 8:
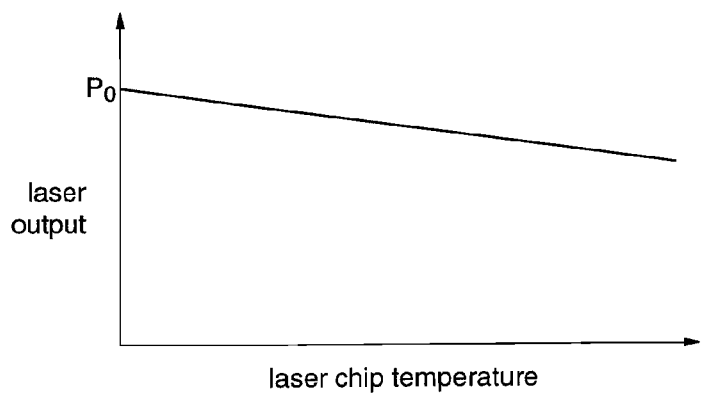
FIG. 8 is a diagram illustrating a relation between the laser chip temperature and the laser output.

Since the semiconductor laser 21 in the light source 20 of the second embodiment has a temperature characteristics that the output thereof is reduced when the temperature is raised as shown in FIG. 8, in the environment where the laser chip is not controlled for its temperature, the starting current value is determined dependent on the laser temperature of the start of the lighting, without making the starting drive current value constant as in the first embodiment.

Figure 9:
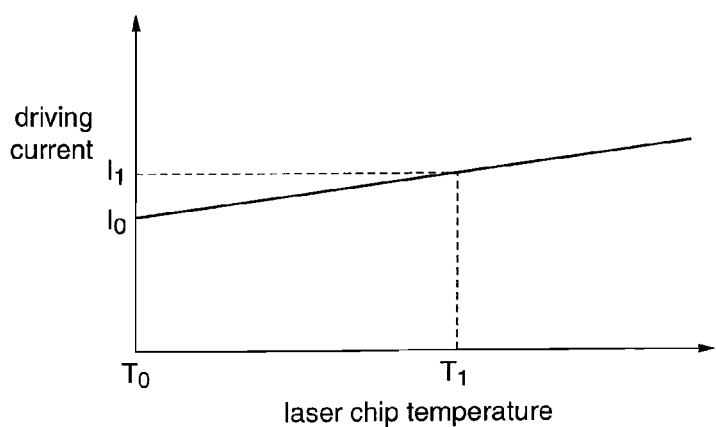
FIG. 9 is a diagram illustrating the relation between the chip temperature and the driving current for obtaining the same output power in the second embodiment of the present invention.

FIG. 9 shows a relation between the chip temperature and the driving current value for obtaining the same output power in the light source 20 of the second embodiment.

When the temperature of laser medium and the current value at start of the lighting is made $T_0$ and $I_0$, respectively, and the temperature of the laser chip at the next lighting is made $T_1$, the drive current value at the temperature $T_1$ can be read as $I_1$, and the laser is driven with the driving current value $I_1$ at the next start of lighting.

In this way, the light source 20 of this second embodiment 20 measures the laser chip temperature before the lighting, and the driving current is determined from the measured temperature, and the lighting is performed. In addition, during the time from the lighting to the un-lighting, the APC operation is carried out similarly as in the first embodiment.

Figure 10:
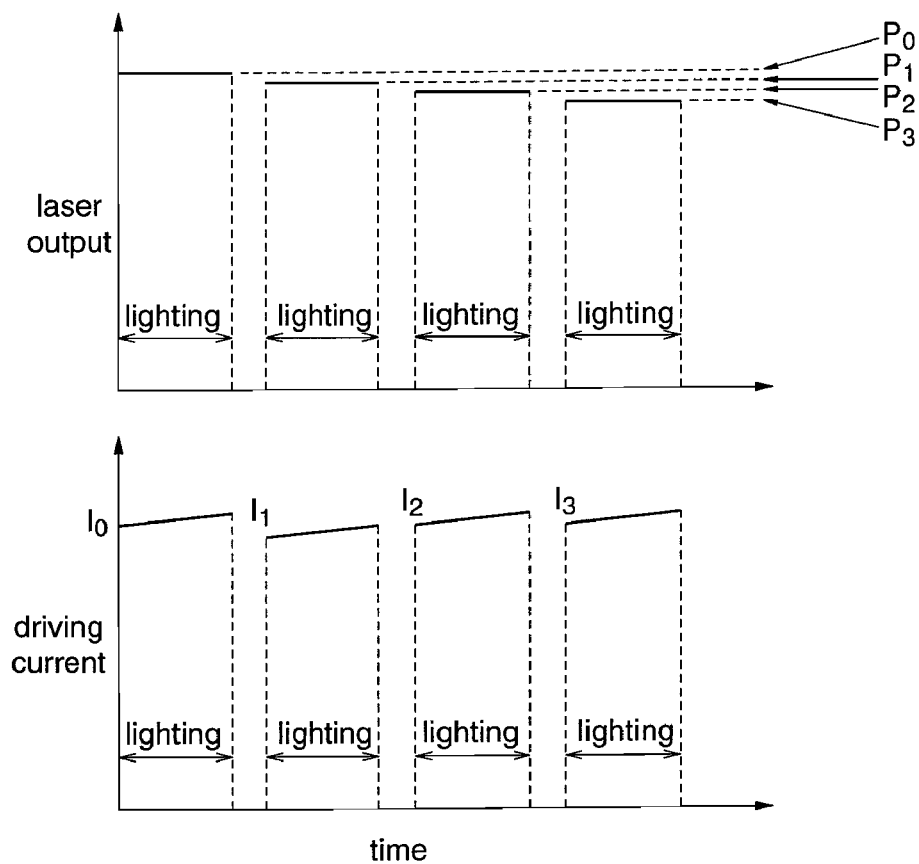
FIG. 10 is a diagram for explaining the time characteristics of the laser driving current and the laser output in the second embodiment of the present invention.

FIG. 10 shows a relation between the drive time and the laser power and a relation between the drive current and the drive current value in the light source 20 according to the second embodiment.

In the light source 20 of this second embodiment, since the APC operation is carried out after the start of the lighting similarly as in the first embodiment, the same power is always kept until the un-lighting is performed. On the other hand, since the driving current value at the start of the lighting is varied dependent on the laser chip temperature, there may be a possibility that the current value at the respective lighting be different. Further, if the long term deterioration during the lighting is considered, the driving current would rise up little by little.

Thus, the light source 20 of this second embodiment is one which determines the starting current value at the time of lighting dependent on the temperature, and with considering the power reduction due to a long-term deterioration, it is possible to prevent from applying a large load to the lasers, and thereby further to realize lengthening of lifetimes of lasers.

Though in the second embodiment the setting of the upper limit for the driving current during the period from the start of lighting to the un-lighting is not carried out in the APC circuit, the setting of the upper limit for this driving current is preferably carried out so as to provide for rapid laser deterioration during the APC operation. Thereby, even when the laser is rapidly deteriorated during the APC operation, it is possible to prevent a great deal increase in the driving current and thereby to prevent the rapid destruction of the laser. In addition, it is preferred that when the upper limit driving current value is reached, the laser power control is switched from the APC operation to the ACC operation.

In addition, though the upper limit temperature for the laser chip is not set in the second embodiment, it is preferred that the upper limit temperature for the laser chip is provided. Thereby, it is possible to prevent that the driving current would increase with following the temperature rise of the laser chip during the APC operation, thereby preventing the rapid LD deterioration. Here, when the upper limit setting for the driving current is carried out, the value of the driving current is determined within the upper limit range, and there is no necessity to provide the upper limit temperature for the laser chip. However, since increasing the temperature of the laser chip is one of the factors that prevent the lengthening of the lifetimes of lasers, the setting of this upper limit temperature for the laser chip is preferred to be carried out.

While in the above second embodiment, a one-chip semiconductor laser light source is supposed as a single wavelength laser light source, a plural-chip semiconductor light source, or a multi-stripe semiconductor laser light source may be employed with the similar control methods being carried out.

Third Embodiment

A light source device according to a third embodiment of the present invention will be described.

The light source device of this third embodiment is a light source device which employs, as one light source among the three laser light sources, the light source which is described in the first embodiment, and this device takes white balances of the other two laser light sources in accordance with the power of that one laser light source.

Figure 11:
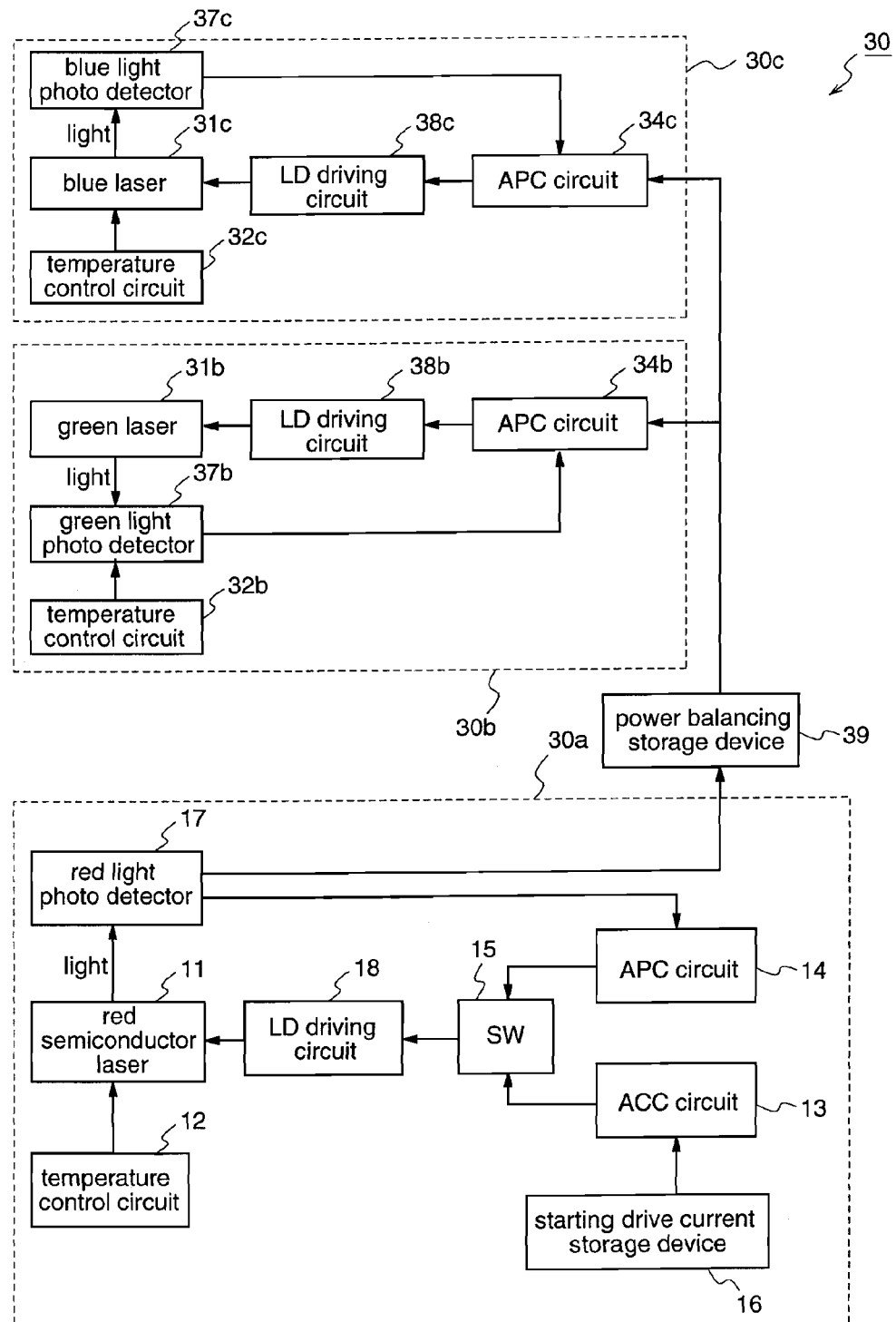
FIG. 11 is a schematic diagram illustrating a light source device according to a third embodiment of the present invention.

FIG. 11 is a schematic construction diagram showing a light source device according to a third embodiment of the present invention.

Figure 22:
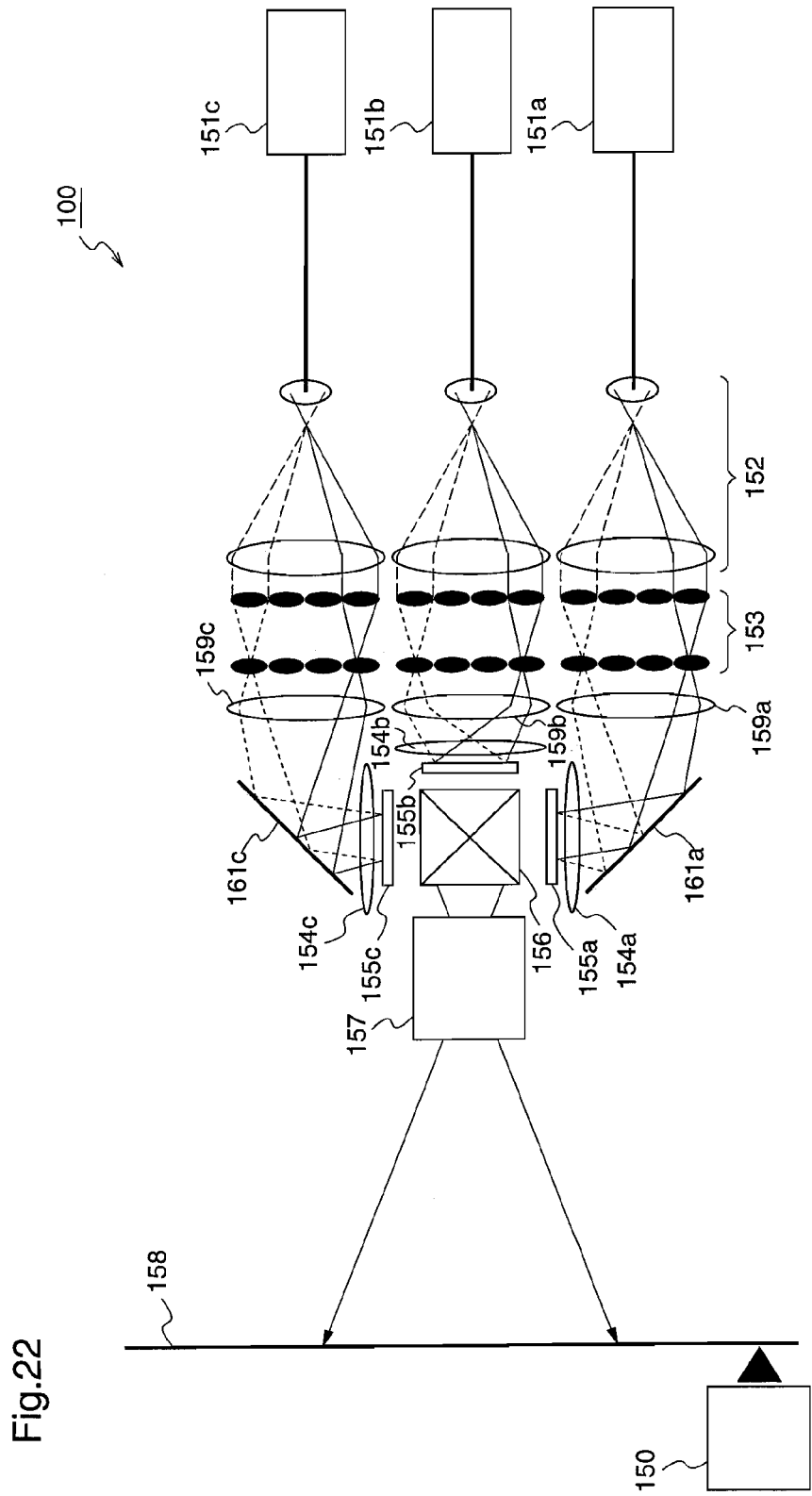
FIG. 22 is a schematic diagram illustrating a laser image forming device according to the prior art.

The light source device 30 shown in FIG. 11 is equipped with R(red), G(green), B(blue) three color laser light sources 30a to 30c, and a power balancing storage device 39 for controlling a power balancing of the RGB three color laser lights, and takes the power balancing by controlling the green laser light source 30b and blue laser light source 30c according to the power of the red laser light source 30a. Herein, it is possible to realize a laser image forming device by replacing the light sources 151a to 151c shown in FIG. 22 by the laser light sources 30a to 30c of this third embodiment.

The red laser light source 30a is a light source of the first embodiment shown in FIG. 1 and the red semiconductor laser 11 which constitutes the laser light source 30a is controlled such that its temperature becomes constant, and the wavelength of the laser light outputted from this red semiconductor laser 11 is constant.

The green laser light source 30b is equipped with a green laser oscillator having a green laser 31b, a driving circuit 38b for the green laser 31b, and an APC circuit 34b, and a green light photo detector 37b, and always performs APC operation based on the output from the power balancing storage device 39. The green laser 31b is controlled so that temperature thereof becomes constant by the temperature control circuit 32b, and the wavelength of the laser light outputted from the green laser 31b is constant.

The blue laser light source 30c is equipped with a blue laser oscillator having a green laser 31c, a driving circuit 38c for the blue laser 31c, and an APC circuit 34c, and a blue light photo detector 37c, and always performs APC operation based on the output from the power balancing storage device 39. The blue laser 31c is controlled so that temperature thereof becomes constant by the temperature control circuit 32c, and the wavelength of the laser light outputted from the blue laser 31c is constant.

Figure 12:
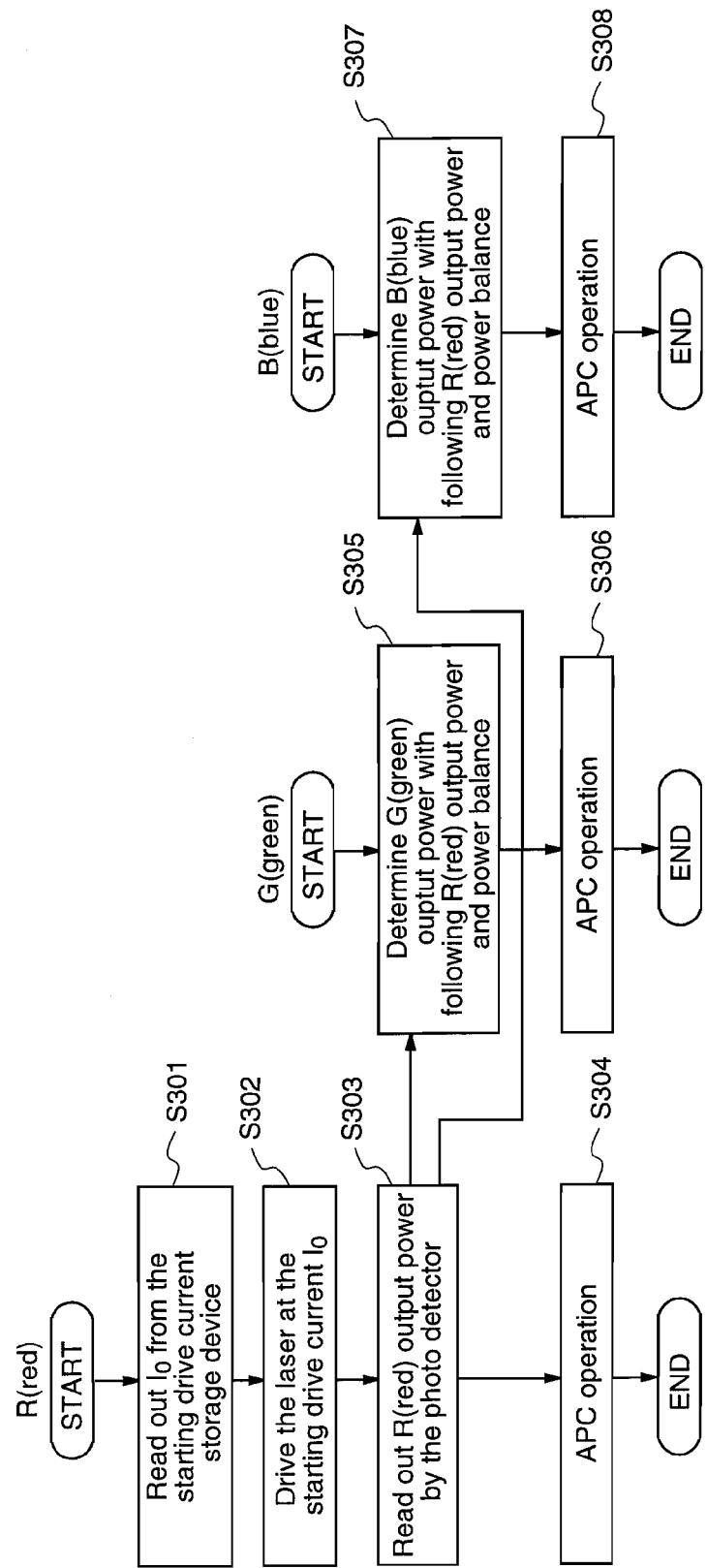
FIG. 12 is a diagram for explaining the algorithm of the power control method in the light source device according to the third embodiment of the present invention.

Next, the power control method in the light source device 30 of the third embodiment will be described with reference to FIG. 12.

In the power control method for the red laser light source 30a, similarly to the power control method according to the first embodiment shown in FIG. 2, first of all, the starting current value $I_0$ is read out from the starting drive current storage device 16 (Step S301), the red semiconductor laser 11 is laser driven with the starting current value $I_0$ (Step S302), the output of the red semiconductor laser 11 which has started the lighting with the starting current value $I_0$ is read out by the photo detector 17 (Step S303), and it is switched to the APC operation so that the output power read out of the red semiconductor laser 11 be constant (Step S304).

On the other hand, in the power control method of the green laser light source 30b and the blue laser light source 30c, after the power of the red laser power light source 30a is determined, the output power of green light and the output power of blue light are determined with following the output power of the red light (Step S305, S307), and the green laser light source 30b and the blue laser light source 30c are subjected to power control by the APC operation so that the output powers of the green laser 31b and the blue laser 31c are constant (Step S306, S308).

Thus, the light source device 30 of this third embodiment is one which performs power controls of the green light source 30b and the blue light source 30c in accordance with the output power of the red laser light source 30a at a timing when the power control of the red laser source 30a entered into the APC operation, and thereby it is possible to take a power balancing of RGB three colors and further it is possible to form images with no color shift. Further, it is possible to suppress the load to the red semiconductor laser 30a to the minimum, and thereby it is possible to lengthen the lifetime of the RGB three color laser sources, particularly, the red semiconductor light source 11, being further advantageous.

Though in the third embodiment the setting of the upper limit for the driving current during the period from the start of lighting to the un-lighting is not carried out in the APC circuit, the setting of the upper limit for this driving current is preferably carried out so as to provide for rapid laser deterioration during the APC operation. Thereby, even when the laser is rapidly deteriorated during the APC operation, it is possible to prevent a great deal increase in the driving current and thereby to prevent the rapid destruction of the laser. In addition, it is preferred that when the upper limit driving current value is reached, the laser power control is switched from the APC operation to the ACC operation.

While in the above third embodiment, a one-chip one-stripe semiconductor laser light source is employed as a red laser light source, a multi-beam laser light source such as a plural-chip semiconductor light source or a multi-stripe semiconductor laser light source may be employed with the similar control methods being applied to the respective resonators.

Furthermore, while in the third embodiment, the powers of the green and blue light sources are determined in accordance with the power of the red laser light source and a white balancing is taken, a method of taking a white balance with employing the power of either of green or blue laser light source as a reference, not of red laser light source, may be employed.

Fourth Embodiment

A light source device according to a fourth embodiment of the present invention will be described.

The light source device of the fourth embodiment is a light source device which employs, as one laser light source among the three laser light sources, the laser light source which is described in the second embodiment, and this device takes white balances of the other two laser light sources in accordance with the power of that one laser light source.

Figure 13:
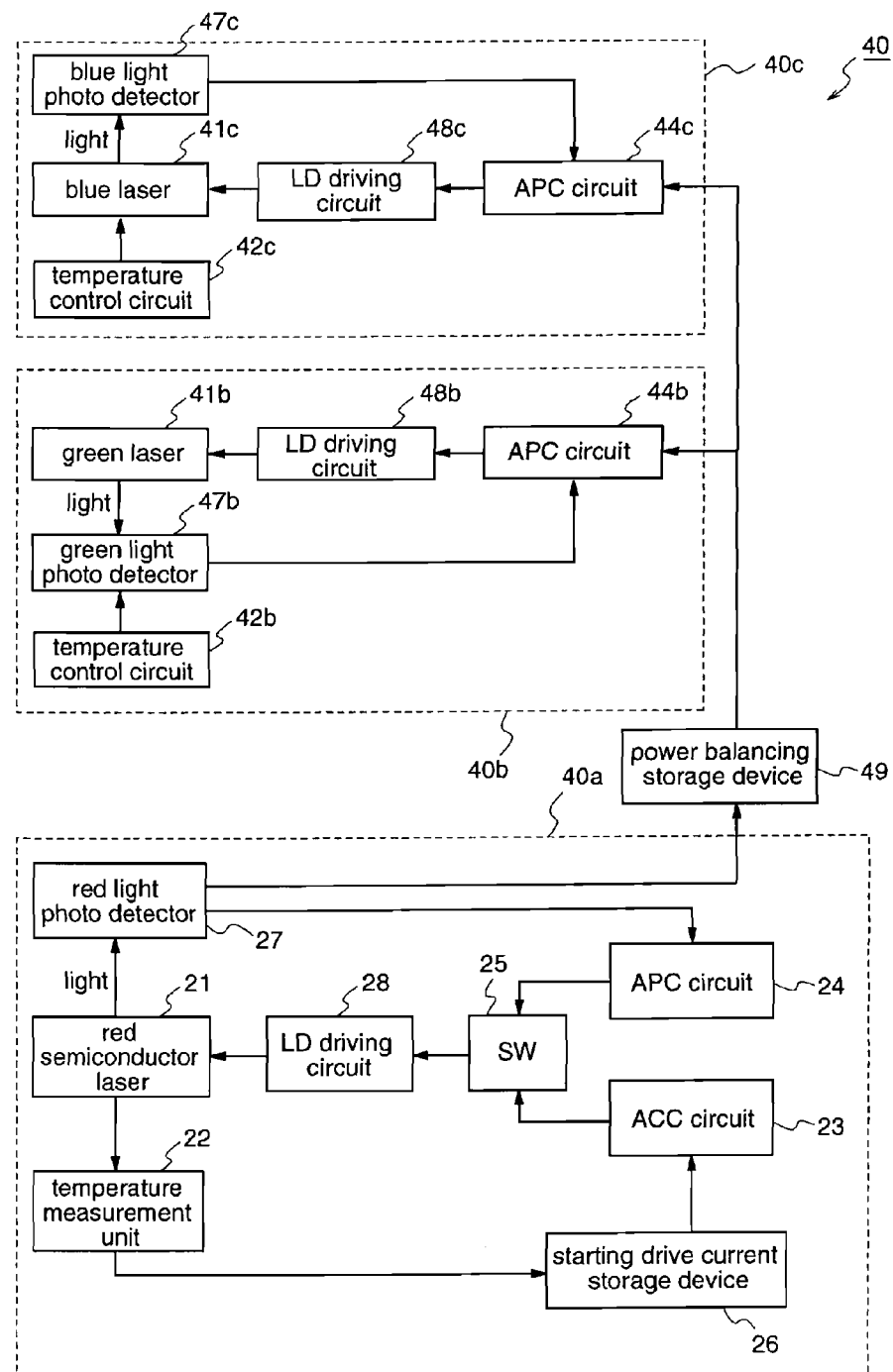
FIG. 13 is a schematic diagram illustrating a light source device according to a fourth embodiment of the present invention.

FIG. 13 is a schematic construction diagram illustrating a light source device according to the fourth embodiment.

The light source device 40 shown in FIG. 13 is equipped with R(red), G(green), B(blue) three color laser light sources 40a to 40c and a power balancing storage device 49 for controlling a power balancing of the RGB three color laser lights, and takes the power balancing by controlling the green laser light source and the blue laser light source according to the power of the red laser light source 40a. Herein, it is possible to realize a laser image forming device by replacing the light sources 151a to 151c shown in FIG. 22 by the laser light sources 40a to 40c of this fourth embodiment.

The red laser light source 40a is a light source according to the second embodiment shown in FIG. 6.

The green laser light source 40b is equipped with a green laser oscillator having a green laser 41b, a driving circuit 48b for the green laser 41b, and an APC circuit 44b, and a green light photo detector 47b, and always performs APC operation based on the output from the power balancing storage device 49. The green laser 41b is controlled so that temperature thereof becomes constant by the temperature control circuit 42b, and the wavelength of the laser light outputted from this green laser 41b is constant.

The blue laser light source 40c is equipped with a blue laser oscillator having a blue laser 41c, a driving circuit 48b for the blue laser 41c, and an APC circuit 44c, and a blue light photo detector 47c, and always performs APC operation based on the output from the power balancing storage device 49. The blue laser 41c is controlled so that temperature thereof becomes constant by the temperature control circuit 42b, and the wavelength of the laser light outputted from this blue laser 41c is constant.

Next, the power control method in the light source device 40 of the fourth embodiment will be described with reference to FIG. 14.

Figure 7:
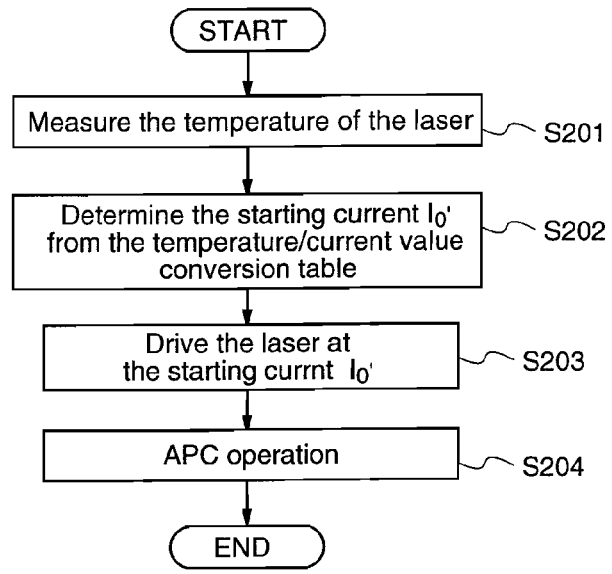
FIG. 7 is a diagram for explaining the algorithm of the power control method in the light source according to the second embodiment of the present invention.

In the power control method for the red laser light source 40a, similarly to the power control method according to the second embodiment shown in FIG. 7, first of all, the temperature of the red semiconductor laser 21 and the driving current value $I_0$ are learned, and then, it is switched to an APC operation so as to perform a power control so that the light output is constant until the red semiconductor laser 21 is un-lightened. Then, the temperature of the semiconductor laser 21 is measured at the start of next lighting (Step S401), and the driving current value $I_0'$ is determined from the temperature versus current value conversion table which is stored in the starting drive current storage device 26 dependent on the measured temperature (Step S402), the red semiconductor laser 21 is laser driven with the driving current $I_0'$ determined (Step S403), and the output and the wavelength of the red semiconductor laser 21 that has started the lighting with the driving current value $I_0'$ is read out by the photo detector 17 (Step S404), and it is switched to the APC operation for controlling the output power of the red semiconductor laser 21 to be constant (Step S405).

On the other hand, in the power control method of the green laser light source 40b and the blue laser light source 40c, after the output power and the wavelength of the red semiconductor laser source 21 is monitored by the red photo detector 27, the output power of the green laser 41b and the output power of the blue laser 41c are determined with following the output power and the wavelength of the red semiconductor laser 21 (Step S406, Step S408), and the power control is performed by the APC operation so that the output powers of the green laser 41b and the blue laser 41c are constant (Step S407, S409).

Thus, the laser light source device 40 of this fourth embodiment is one which performs power controls of the green light source 40b and the blue light source 40c in accordance with the output power and the wavelength of the red laser light source 40a at a timing when the power control of the red laser source 21 entered into the APC operation, and thereby it is possible to take a power balancing of RGB three colors and further it is possible to form images with no color shift. Further, it is possible to suppress the load to the red semiconductor laser 21 to the minimum, and thereby it is possible to lengthen the lifetime of the RGB three color laser sources, particularly, the red semiconductor light source 40a, being further advantageous.

Figure 15:
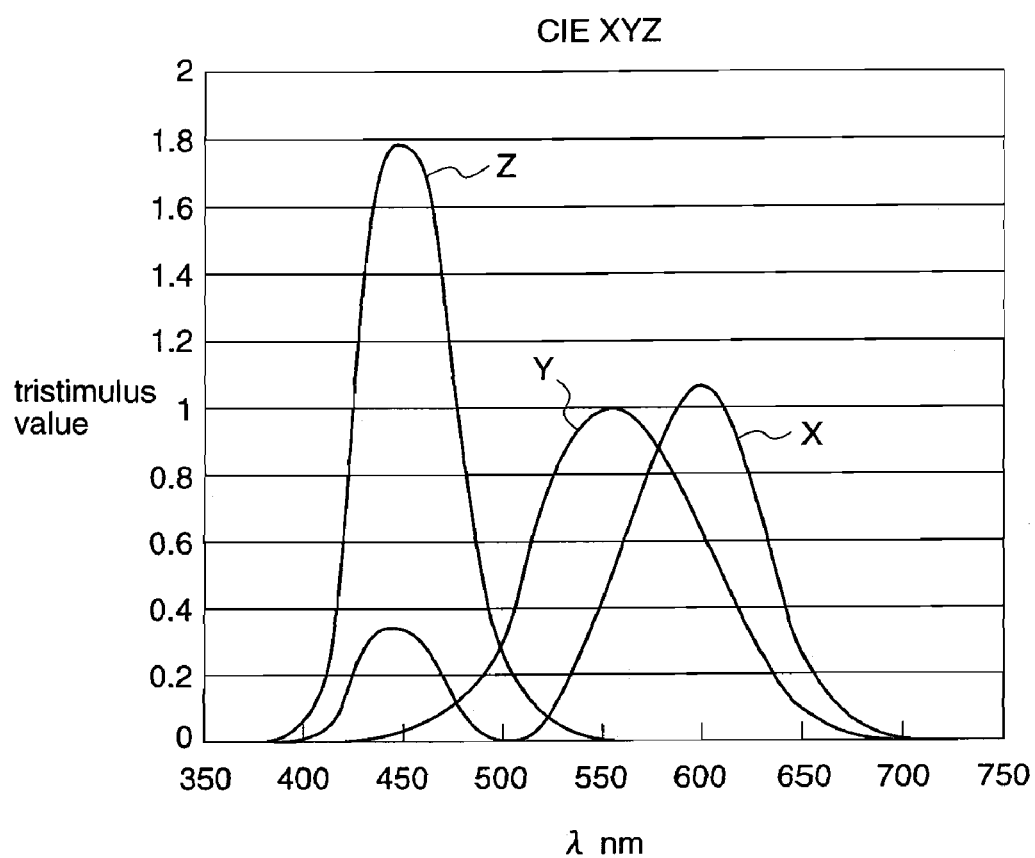
FIG. 15 is a diagram illustrating the relation between the wavelength and the tristimulus value.

Herein, in this fourth embodiment, a white balancing is taken with paying considerations on the wavelength change of the red semiconductor laser. Three stimulus curves are shown in FIG. 15. Three stimulus curves represent numerical values for making eyes recognize colors, and the colors are more strongly recognized as these values are high. The X stimulus values represent values for recognizing colors as red, the Y stimulus values represent values for recognizing colors as green, and the Z stimulus values represent values for recognizing colors as blue. As shown in FIG. 15, X stimulus values in the vicinity of the wavelength of 630 nm varies rapidly with the wavelength varies. That is, the red laser with a wavelength of 630 nm in the fourth embodiment will lose the white balance by a little wavelength change. For this reason, taking a white balance by determining the power of the green laser 41b and the blue laser 41c in accordance with the wavelength and the power of the red semiconductor laser 21 as in this fourth embodiment is effective in cases where the red semiconductor laser 21 is not temperature controlled, or the wavelength of the red semiconductor laser 21 is not constant.

Figure 14:
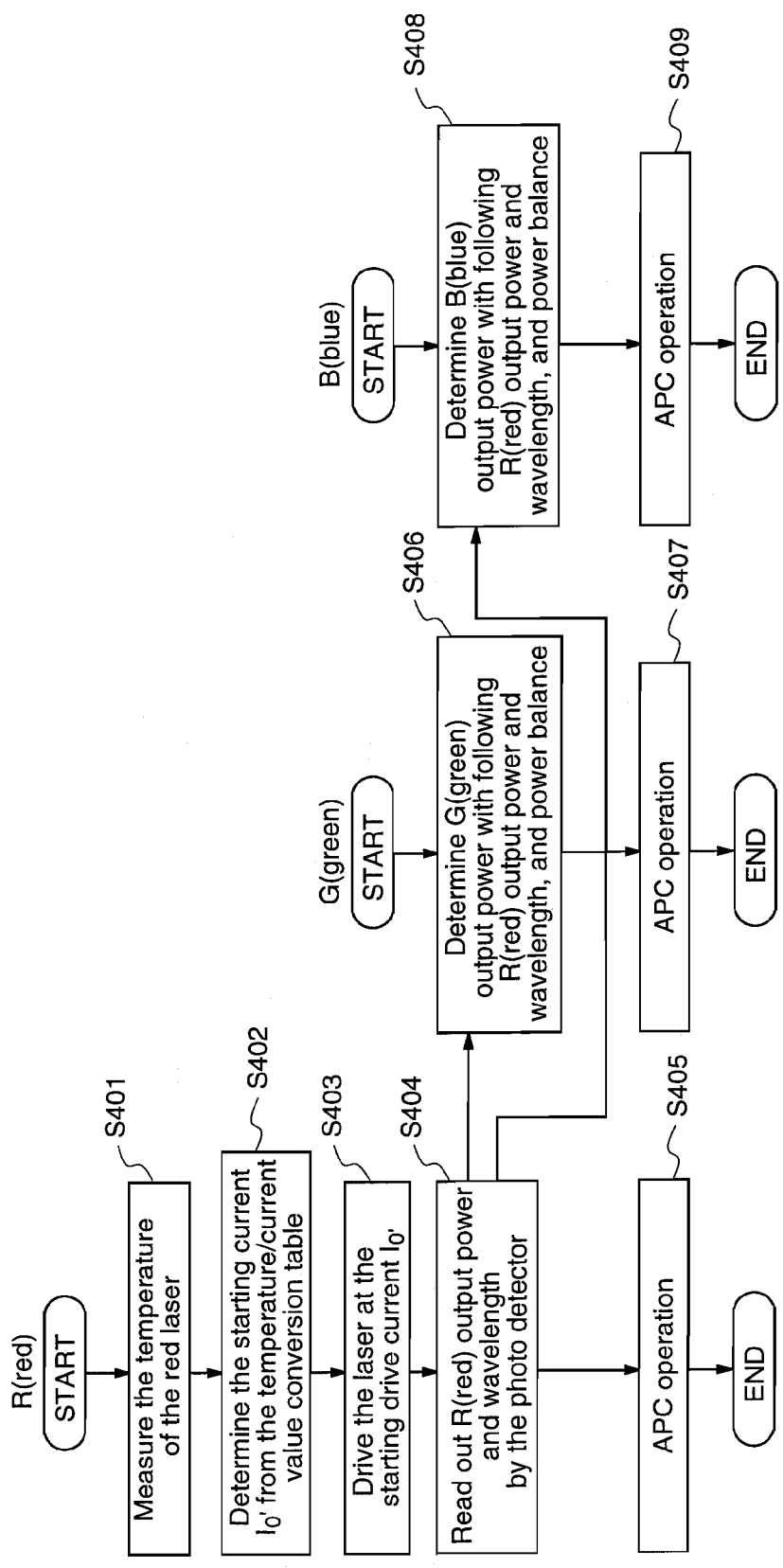
FIG. 14 is a diagram for explaining the algorithm of the power control method in the light source device according to the fourth embodiment of the present invention.

While in the fourth embodiment, a case where the wavelength of red laser is monitored in Step S401 in FIG. 14, the temperature of the red semiconductor laser may be monitored to obtain the wavelength from the monitored temperature. Further, both of the temperature and the wavelength may be monitored.

When the wavelength is calculated by the laser temperature measurement, it is preferred that the laser temperature measurement is carried out at the start of lighting as well as during lighting, thereby to calculate the wavelength successively, and feedbacks the same to the APC operation of the green laser and the blue laser.

Though in the fourth embodiment the setting of the upper limit for the driving current during the period from the start of lighting to the un-lighting is not carried out in the APC circuit, the setting of the upper limit for this driving current is preferably carried out so as to provide for rapid laser deterioration during the APC operation. Thereby, even when the laser is rapidly deteriorated during the APC operation, it is possible to prevent a great deal increase in the driving current and thereby to prevent the rapid destruction of the laser. In addition, it is preferred that when the upper limit driving current value is reached, the laser power control is switched from the APC operation to the ACC operation.

In addition, though the upper limit temperature for the laser chip is not set in the fourth embodiment, it is preferred that the upper limit temperature for the laser chip is provided. Thereby, it is possible to prevent that the driving current would increase with following the temperature rise of the laser chip during the APC operation, thereby preventing the rapid LD deterioration. Here, when the upper limit setting for the driving current is carried out, the value of the driving current is determined within the upper limit range, and there is no necessity to provide the upper limit temperature for the laser chip. However, since increasing the temperature of the laser chip is one of the factors that prevent the lengthening of the lifetimes of lasers, the setting of this upper limit temperature for the laser chip is preferred to be carried out, if possible.

While in the above fourth embodiment a one-chip one-stripe semiconductor laser light source is employed as a red laser light source, a multi-beam laser light source such as a plural-chip semiconductor light source or a multi-stripe semiconductor laser light source may be employed with the similar control methods being applied to the respective resonators.

Furthermore, while in the fourth embodiment the powers of the green and blue light sources are determined in accordance with the wavelength and the power of the red laser light source and a white balancing is taken, a method of taking a white balance with employing the wavelength and the power of either of green or blue laser light source as a reference, not of red laser light source, may be employed.

Fifth Embodiment

A light source device according to a fifth embodiment of the present invention will be described.

The light source device of this fifth embodiment is a light source device in which one laser light source among the three laser light sources is always controlled using an ACC circuit, and white balances of the other two laser light sources are taken according to the power of that one light source.

Figure 16:
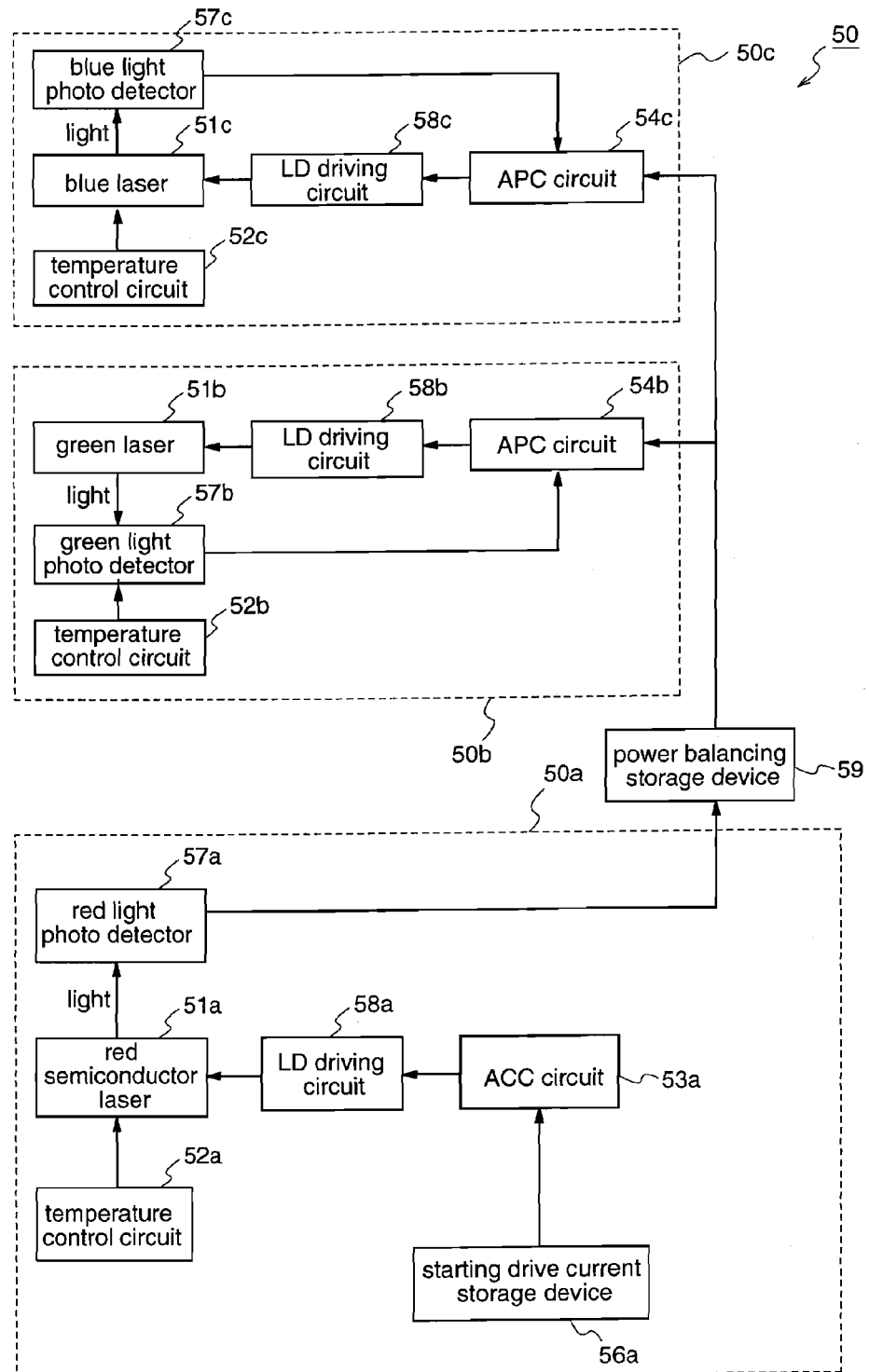
FIG. 16 is a schematic diagram illustrating a light source device according to a fifth embodiment of the present invention.

FIG. 16 is a schematic construction diagram illustrating a light source device according to the fifth embodiment.

The light source device 50 shown in FIG. 16 is equipped with R(red), G(green), and B(blue) three color laser light sources 50a to 50c and a power balancing storage device 59 for controlling a power balancing of the RGB three color laser lights, and takes the power balancing by controlling the green laser light source 50b and the blue laser light source 50c according to the power of the red laser light source 50a. Herein, it is possible to realize a laser image forming device by replacing the light sources 151a to 151c shown in FIG. 22 by the laser light sources 50a to 50c of this fifth embodiment.

The red light source 50a is equipped with a red laser oscillator having a red semiconductor laser 51a, a driving circuit 58a for the laser 51a, and an ACC circuit 53a, a temperature control circuit 52a, a starting drive current storage device 56a, and a red photo detector 57a, and the light source learns the driving current value at start of lighting by the starting drive current storage device 56a, and always carries out the ACC operation.

The green laser light source 50b is equipped with a green laser oscillator having a green laser 51b, the driving circuit 58b for the laser 51b, and an APC circuit 54b, a temperature control circuit 52b, and a green photo detector 57b, and the always performs the APC operation based on the output from the power balancing storage device 59.

The blue laser light source 50c is equipped with a blue laser oscillator having a blue laser 51c, a driving circuit 58c for the laser 51c, and an APC circuit 54c, a temperature control circuit 52c, and a blue photo detector 57c, and always performs the APC operation based on the output from the power balancing storage device 59.

Figure 17:
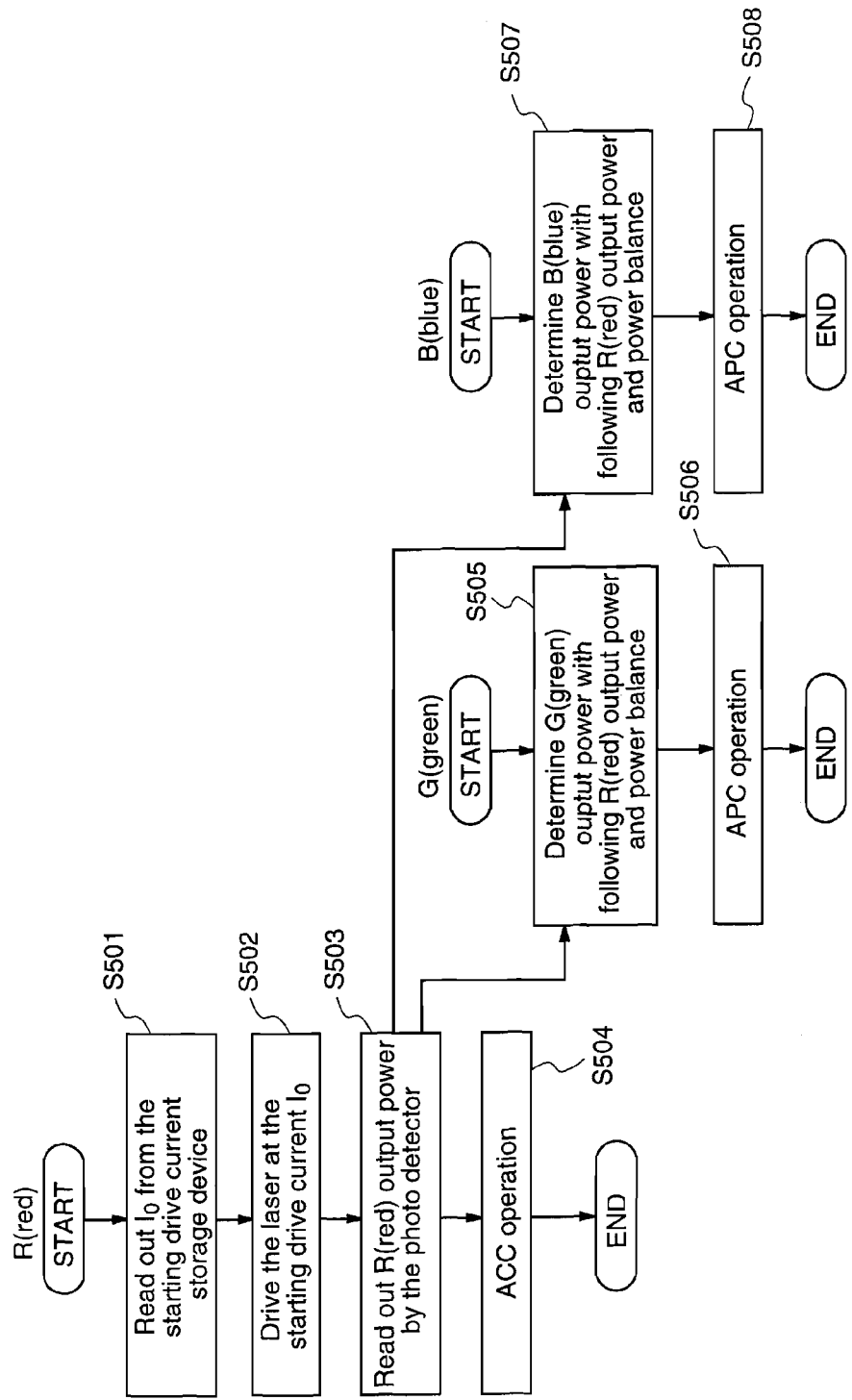
FIG. 17 is a diagram for explaining the algorithm of the power control method in the light source device according to the fifth embodiment of the present invention.

Next, the power control method in the light source device 50 of the fifth embodiment will be described with reference to FIG. 17.

In the power control method of the red laser light source 50a, first of all, the starting current value $I_0$ is read out from the starting drive current storage device 56a (Step G501), and the red semiconductor laser 51a is laser driven with the starting current value $I_0$. Then, the output of the red semiconductor laser 51a is read out by the photo detector 57a (Step S503), it is controlled by the ACC operation such that the driving current value of the red semiconductor laser 51a is made constant (Step S504).

On the other hand, in the power control methods of the green laser light source 50b and the blue laser light source 50c, the output powers of the green laser light source 50b and the blue laser light source 50c are determined with following the output power of the red semiconductor laser 51a which is read out by the photo detector 57a in the step S503 (Step S505, S507), and the power control is performed by the APC operation so that the output powers of the green laser 51b and the green laser 501c are constant (Step S506, S508).

Thus, the laser light source device 50 of this fifth embodiment is one which performs the APC operation according to the output powers of the green laser 51b and the blue laser 51c determined with following the output power of the red semiconductor laser 51a which is controlled by the ACC operation so that the driving current value is constant, and thereby it is possible to provide images having no color shift with taking a power balance of RGB three colors. Further, it is possible to suppress the load to the red semiconductor laser 51a to the minimum, and to lengthen the lifetimes of the RGB three colors, being further effective.

In addition, in this fifth embodiment, the red laser light source 50a is always under the ACC operation, and no switching is performed to the APC operation as in the third embodiment. Therefore, there is no rise of the driving current during lighting and it is possible to reduce the degree of advance of deterioration, being more effective.

Further, in this fifth embodiment, since the green laser light source 50b and the blue laser light source 50c perform the APC operation, the setting of the upper limit for driving current is preferably carried out so as to provide for the rapid laser degradation under the APC operation. Thereby, even when the laser is rapidly deteriorated during the APC operation, it is possible to prevent a great deal increase in the driving current value and thereby to prevent the steep destruction of the laser. In addition, it is preferred that when the upper limit driving current value is reached, the laser power control is switched from the APC operation to the ACC operation.

In addition, though the upper limit temperature for the laser chip is not set in the fifth embodiment, it is preferred that the upper limit temperature for the laser chip is provided. Thereby, it is possible to prevent that the driving current would increase with following the temperature rise of the laser chip during the APC operation, thereby preventing the rapid LD deterioration. Here, when the upper limit setting for the driving current is carried out, the value of the driving current is determined within the upper limit range, and there is no necessity to provide the upper limit temperature for the laser chip. However, since increasing the temperature of the laser chip is one of the factors that prevent the lengthening of the lifetimes of lasers, the setting of this upper limit temperature for the laser chip is preferred to be carried out, if possible.

While in the above fifth embodiment a one-chip one-stripe semiconductor laser light source is employed as a red laser light source, a multi-beam laser light source such as a plural-chip semiconductor light source or a multi-stripe semiconductor laser light source may be employed with the similar control methods being applied to the respective resonators.

Further, in the fifth embodiment, the wavelengths of the three color lights are constant, and while taking the white balance between the three colors, the power ratio of the three color lasers are controlled as constant. When the wavelength of the laser is varied, the white balance is to be taken with paying considerations on that the power ratios for the power balance is changed. Also when the wavelength changes and the output power changes due to the temperature change of the laser oscillator are generated, the control of the white balance is similarly required.

Furthermore, while in the fifth embodiment the powers of the green and blue light sources are determined in accordance with the power of the red laser light source and a white balancing is taken, a method of taking a white balance with employing the power of either of green or blue laser light source as a reference, not of red laser light source, may be employed.

In the fifth embodiment, since the red laser light source 50*a* is performing the ACC operation, the power during lighting is gradually lowered when observed over a long term. Therefore, it is preferred to carry out the power measurement not only at the start of lighting but also during the lighting, and to occasionally feedback the measured result to the APC operations of the green laser and the blue laser thereby to control the white balance.

Sixth Embodiment

A light source device according to a sixth embodiment of the present invention will be described.

The light source device of this sixth embodiment is a light source device which operates the respective three laser light sources by performing a constant current control (ACC) with the driving current that is determined at the initial time to perform a power learning, and takes the power balance of the other laser sources in accordance with the laser source that has the largest deterioration (power deterioration).

Figure 18:
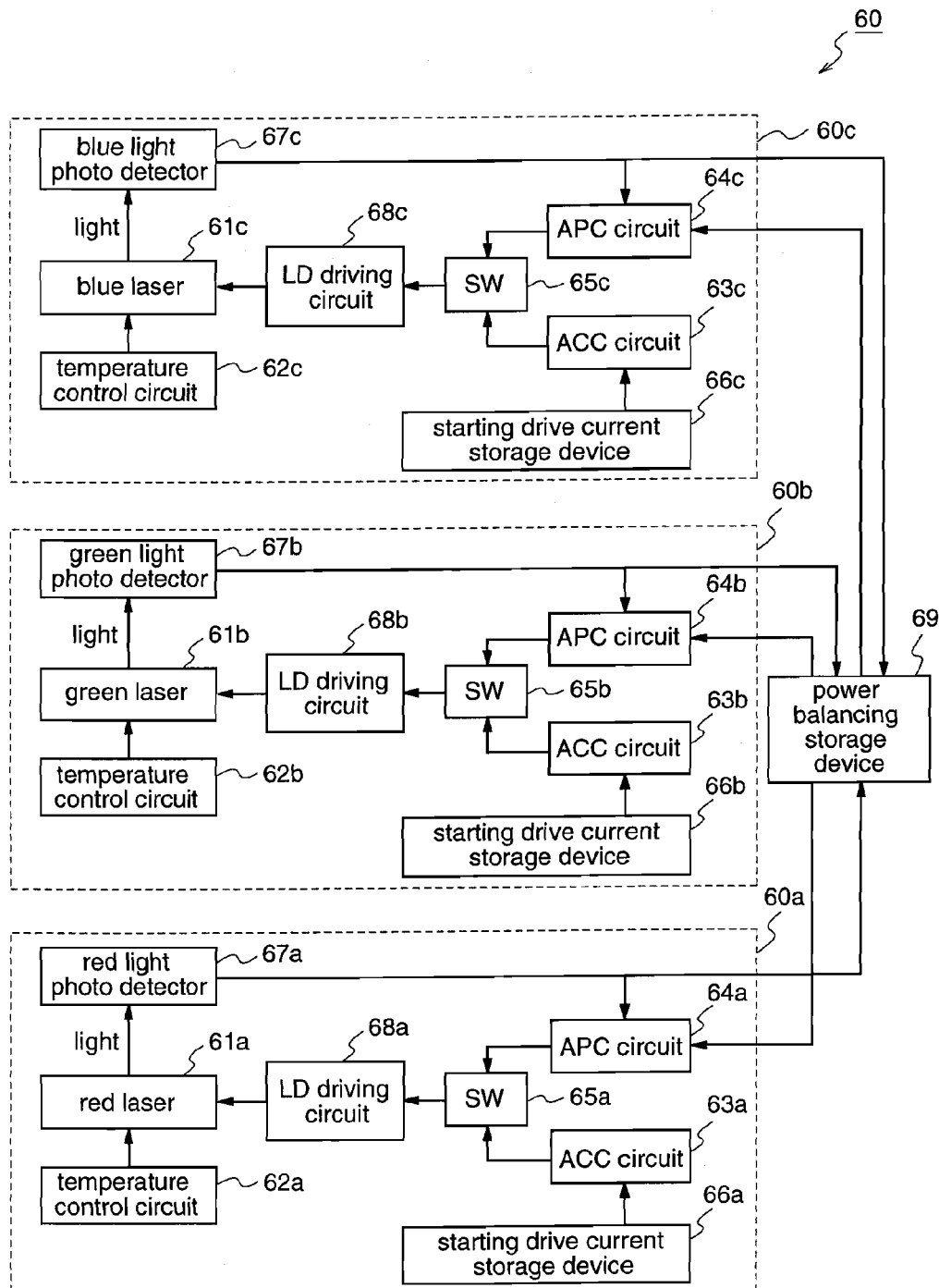
FIG. 18 is a schematic diagram illustrating a light source device according to a sixth embodiment of the present invention.

FIG. 18 is a schematic configuration diagram illustrating a light source device according to this sixth embodiment.

The light source device 60 shown in FIG. 18 is equipped with R(red), G(green), and B(blue) three color laser light sources 60*a* to 60*c* and a power balancing storage device 69 for controlling the power balance of the three color laser lights, and takes a power balancing by controlling the other two laser lights in accordance with the most deteriorated laser light source. Herein, it is possible to realize a laser image forming device by replacing the light sources 151*a* to 151*c* shown in FIG. 22 by the laser light sources 60*a* to 60*c* of this sixth embodiment.

The constructions of the respective laser light sources 60*a*-60*c* are the same as the constructions of the light sources shown in FIG. 1.

That is, the red laser light source 60*a* is equipped with a red laser oscillator having a red laser 61*a*, the driving circuit 68*a* for the laser 61*a*, an ACC circuit 63*a*, an APC circuit 64*a*, and a switch 65*a*, a temperature control circuit 62*a*, a starting drive current storage device 66*a*, and a red photo detector 67*a*.

Further, the green laser light source 60*b* is equipped with a green laser oscillator having a green laser 61*b*, the driving circuit 68*b* for the laser 61*b*, an ACC circuit 63*b*, an APC circuit 64*b*, and a switch 65*b*, a temperature control circuit 62*b*, and a starting drive current storage device 66*b*. Further, the blue laser light source 60*c* is equipped with a blue laser oscillator having a blue laser 61*c*, a driving circuit 68*c* for the laser 61*c*, an ACC circuit 63*c*, an APC circuit 64*c*, and a switch 65*c*, temperature control circuit 62*c*, and a starting drive current storage device 66*c*.

In addition, although the respective laser light sources 60*a* to 60*c* are provided with ACC circuits 63*a* to 63*c* in the above, these laser sources are not necessarily provided with the ACC circuit 63*a* to 63*c*. In this case, the outputs of the starting drive current storage device 66*a* to 66*c* may be connected to the switches 65*a* to 65*c*.

Figure 19:
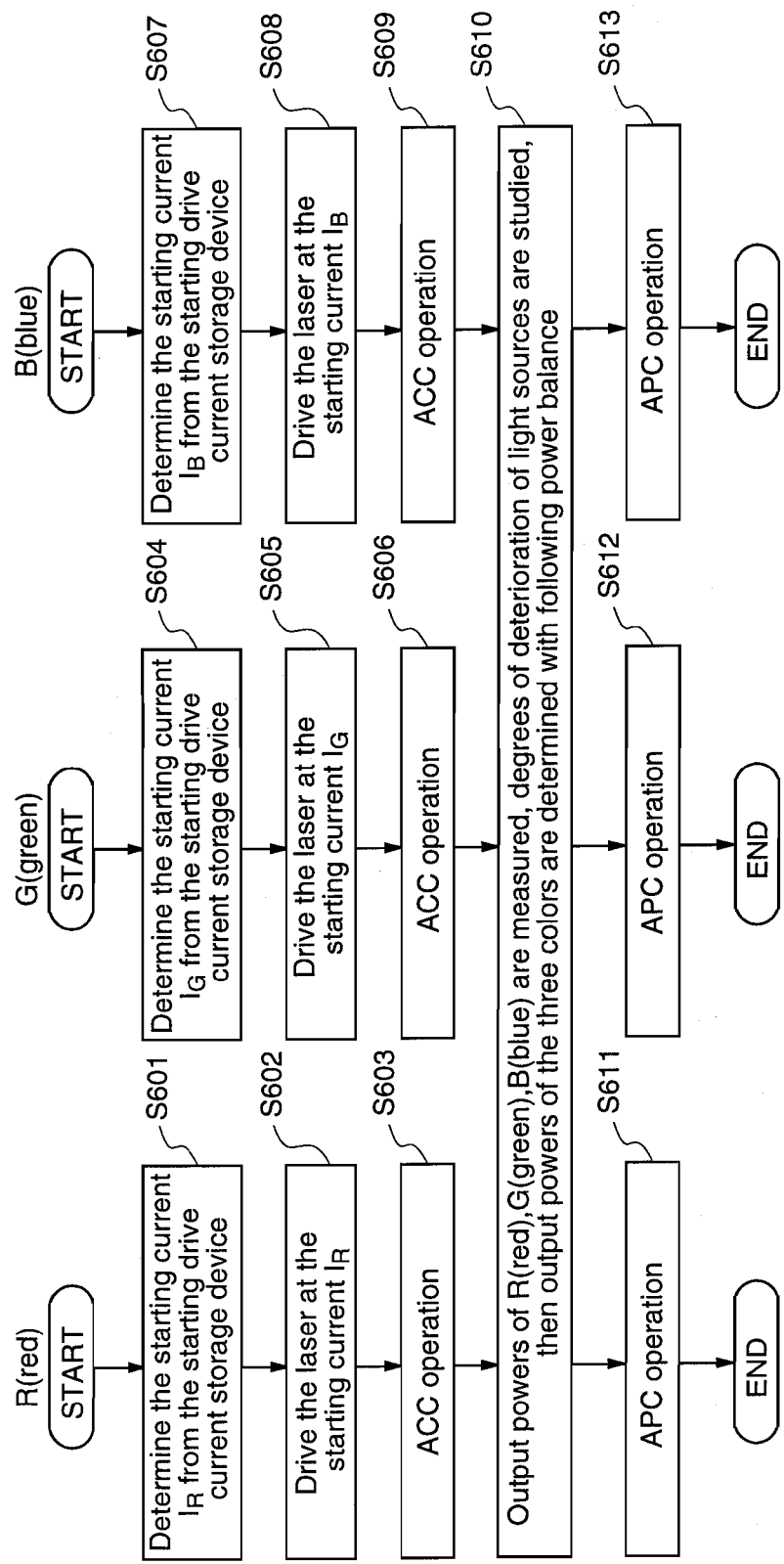
FIG. 19 is a diagram for explaining the algorithm of the power control method in the light source device according to the sixth embodiment of the present invention.

Next, the power control method in the light source device 60 of the sixth embodiment will be described with reference to FIG. 19.

In the power control method of the red laser light source 60*a*, the driving current value $I_R$ is determined from the starting drive current storage device 66*a* (Step S601), the red semiconductor laser 61*a* is laser driven by the driving current value $I_R$ (Step S602), and the red laser 61*a* is controlled by the ACC operation (Step S603).

In the power control method of the green laser light source 60*b*, the driving current value $I_G$ is determined from the starting drive current storage device 66*b* (Step S604), the laser drive of the green laser 61*b* is carried out with this determined driving current value $I_G$ (Step S605), and the green laser 61*b* is controlled by ACC operation (Step S606).

Further, in the power control method of the blue laser light source 60*c*, the driving current value $I_B$ is determined from the starting drive current storage device 66*c* (Step S607), the laser drive of the blue laser 61*c* is carried out with this determined driving current value $I_B$ (Step S608), and the blue laser 61*c* is controlled by ACC operation (Step S609).

Then, the output powers of the RGB three color lasers 61*a* to 61*c* are monitored with respective photo detectors 67*a* to 67*c*, and the output powers of the RGB three colors are determined so that the power balances between the three colors are constant (Step S610). Then, the output powers of the respective lasers 61*a* to 61*c* are all kept under the values detected by the photo detectors 67*a* to 67*c*. Then, the RGB three color lasers 61*a* to 61*c* are driven and controlled by the APC operation on the basis of the respective output powers which are determined at Step S601 (Step S611, 5612, S613).

Thus, the laser light source device 60 of this sixth embodiment is one which makes the respective RGB three color lasers 61*a* to 61*c* lighting with the driving current that is learned at the initial time at the start of driving to perform the ACC operation, the output powers then are respectively monitored by the respective photo detectors 67*a* to 67*c*, the respective output powers are adjusted by the power ratios which are previously stored so that the power balances of the respective lasers 61*a* to 61*c* are constant, thereby performing the power control of the respective lasers 61*a* to 61*c*. Thereby, it is possible to suppress the load to the laser light source which is most advancing in its deterioration (the output reduction amount is large) among the three color laser light sources 60*a* to 60*c*, and it is possible to lengthen the lifetimes of the RGB three color laser light sources which are essential for the laser image forming device more than before, and thus it is possible to provide images with no color shift for a long period more effectively.

Though in the sixth embodiment the setting of the upper limit for the driving current during the period from the start of lighting to the un-lighting is not carried out in the APC circuit, the setting of the upper limit for this driving current is preferably carried out so as to provide for rapid laser deterioration during the APC operation. Thereby, even when the laser is rapidly deteriorated during the APC operation, it is possible to prevent a great deal increase in the driving current and thereby to prevent the rapid destruction of the laser. In addition, it is preferred that when the upper limit driving current value is reached, the laser power control is switched from the APC operation to the ACC operation.

In addition, though the upper limit temperature for the laser chip is not set in the sixth embodiment, it is preferred that the upper limit temperature for the laser chip is provided. Thereby, it is possible to prevent that the driving current would increase with following the temperature rise of the laser chip during the APC operation, thereby preventing the rapid LD deterioration. Here, when the upper limit setting for the driving current is carried out, the value of the driving current is determined within the upper limit range, and there is no necessity to provide the upper limit temperature for the laser chip. However, since increasing the temperature of the laser chip is one of the factors that prevent the lengthening of the lifetimes of lasers, the setting of this upper limit temperature for the laser chip is preferred to be carried out, if possible.

While in the above sixth embodiment a one-chip one-stripe semiconductor laser light source is employed as the RGB three color laser light sources or a excitation light source, a multi-beam laser light source such as a plural-chip semiconductor light source or a multi-stripe semiconductor laser light source may be employed with the similar control methods being applied.

Further, in the sixth embodiment, the wavelengths of the three color lights are constant, and while taking the white balance between the three colors, the power ratio of the three color lasers are controlled as constant. When the wavelength of the laser is varied, the white balance is to be taken with paying considerations on that the power ratios for the power balance is changed. Also when the wavelength changes and the output power changes due to the temperature change of the laser oscillator are generated, the control of the white balance is similarly required.

Seventh Embodiment

A light source device according to a seventh embodiment of the present invention will be described.

The light source device of this seventh embodiment is a light source device which operates the respective three laser light sources by performing a constant current control (ACC) with the driving current that is determined at the initial time to perform a power learning, and takes the power balance of the other laser sources in accordance with the laser source that has the largest deterioration (power deterioration).

Figure 20:
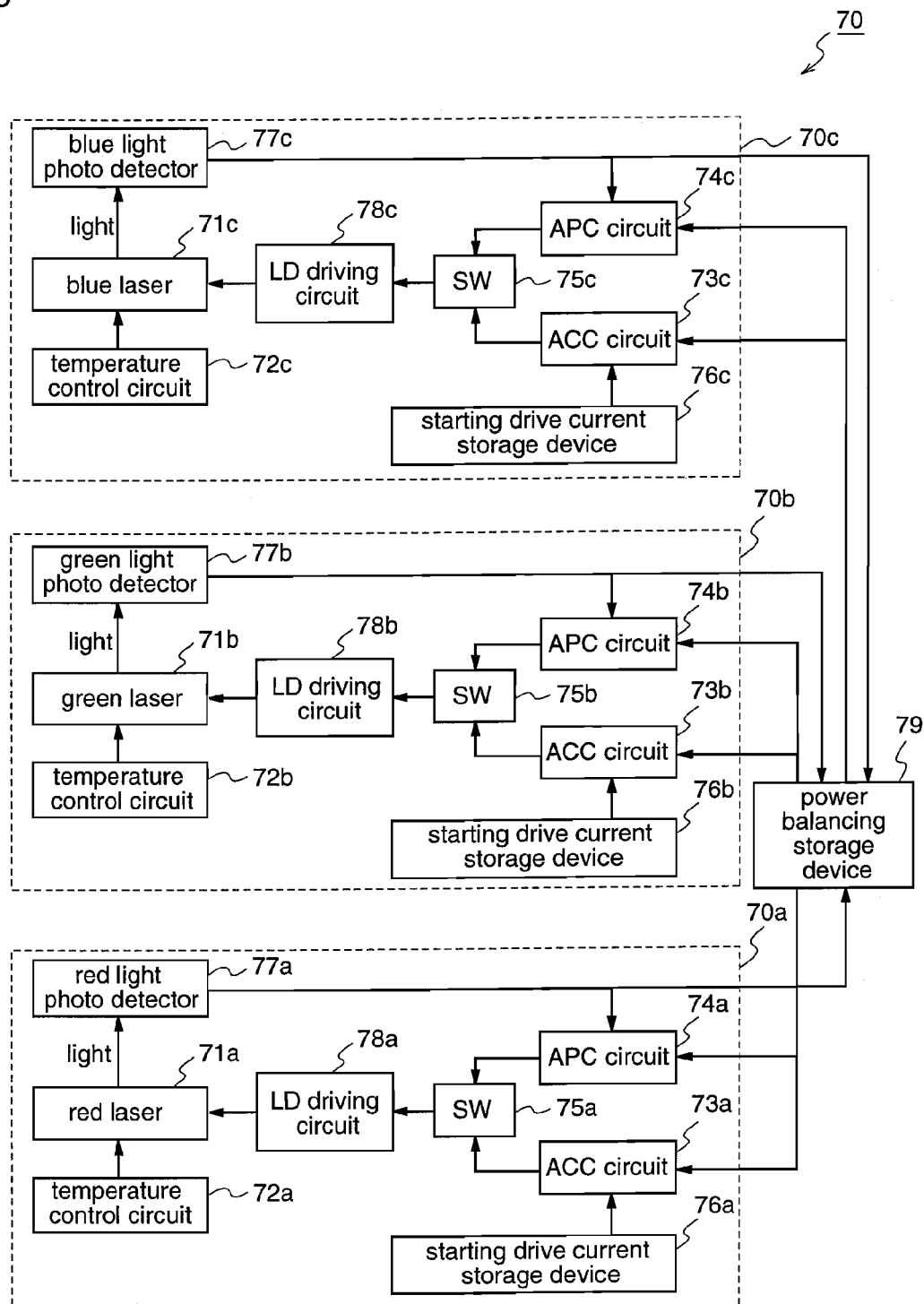
FIG. 20 is a schematic diagram illustrating a light source device according to a seventh embodiment of the present invention.

FIG. 20 is a schematic configuration diagram illustrating a light source device according to this seventh embodiment.

The light source device 70 shown in FIG. 20 is equipped with R(red), G(green), and B(blue) three color laser light sources 70a to 70c and a power balancing storage device 79 for controlling the power balance of the three color laser lights, and takes a power balance by controlling the other two laser lights in accordance with the most deteriorated laser light source. Herein, it is possible to realize a laser image forming device by replacing the light sources 151a to 151c shown in FIG. 22 by the laser light sources 70a to 70c of this seventh embodiment.

The constructions of the respective laser light sources 70a-70c are the same as the constructions of the light sources shown in FIG. 1.

That is, the red laser light sources 70a is equipped with a red laser oscillator having a red laser 71a, the driving circuit 78a for the laser 71a, an ACC circuit 73a, an APC circuit 74a, and a switch 75a, a temperature control circuit 72a, a starting drive current storage device 76a, and a red photo detector 77a. Further, the green laser light source 70b is equipped with a green laser oscillator having a green laser 71b, the driving circuit 78b for the laser 71b, an ACC circuit 73b, an APC circuit 74b, and a switch 75b, a temperature control circuit 72b, and a starting drive current storage device 76b. Further, the blue laser light source 70c is equipped with a blue laser oscillator having a blue laser 71c, a drive circuit 78c for the laser 71c, an ACC circuit 73c, an APC circuit 74c, and a switch 75c, a temperature control circuit 72c, and a starting drive current storage device 76c.

In addition, although the respective laser light sources 70a to 70c are provided with ACC circuits 73a to 73c in the above, these laser sources are not necessarily provided with the ACC circuit 73a to 73c. In this case, the outputs of the starting drive current storage device 76a to 76c may be connected to the switches 75a to 75c.

Figure 21:
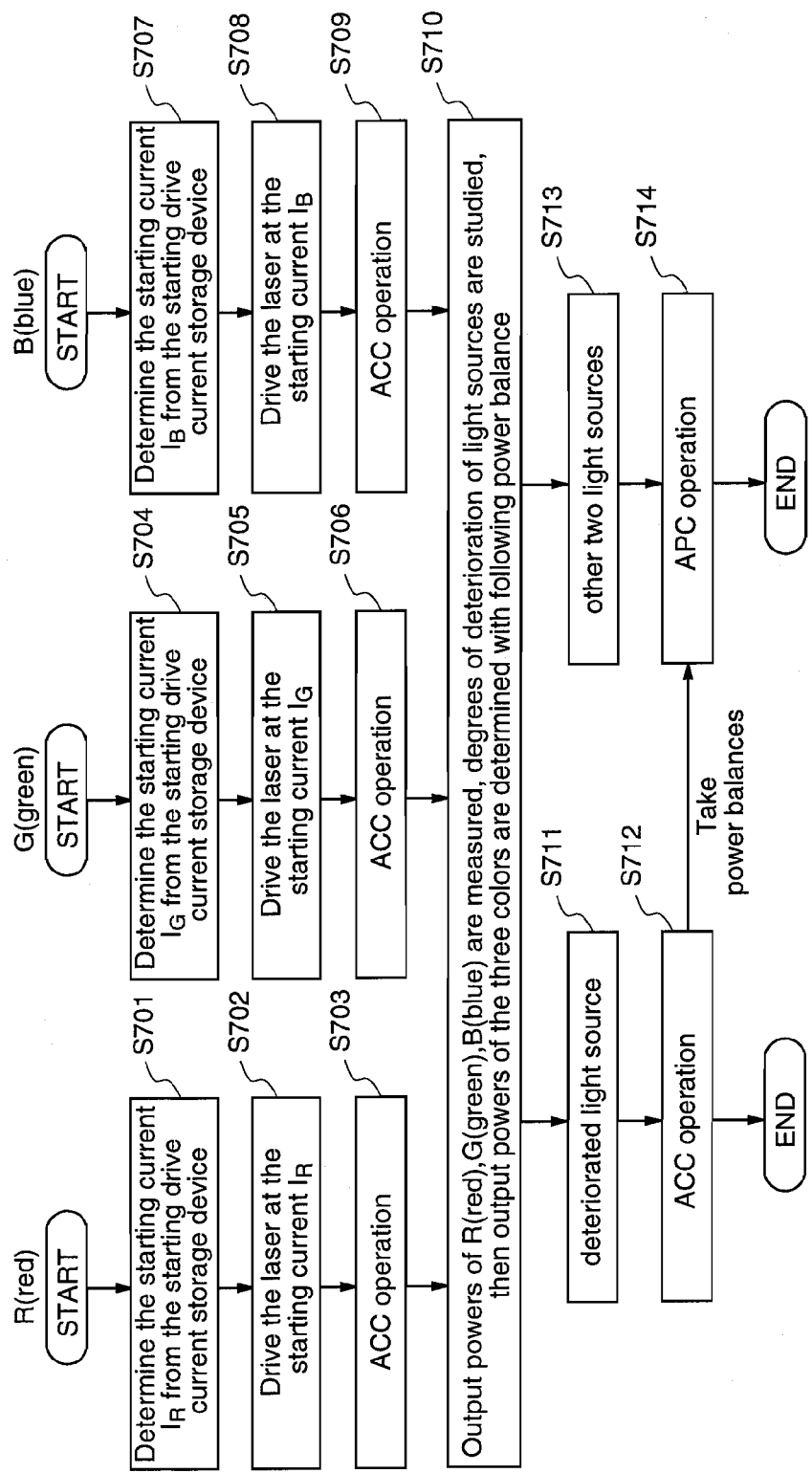
FIG. 21 is a diagram for explaining the algorithm of the power control method in the laser image forming device according to the seventh embodiment of the present invention.

Next, the power control method in the light source device 60 of the seventh embodiment will be described with reference to FIG. 21.

In the power control method of the red laser light source 70a, the driving current value $I_R$ is determined from the starting drive current storage device 76a (Step S701), the red semiconductor laser 71a is laser driven by the driving current value $I_R$ (Step S702), and the red laser 71a is controlled by the ACC operation (Step S703).

In the power control method of the green laser light source 70b, the driving current value $I_G$ is determined from the starting drive current storage device 76b (Step S704), the laser drive of the green laser 71b is carried out with this determined driving current value $I_G$ (Step S705), and the green laser 71b is controlled by ACC operation (Step S706).

Further, in the power control method of the blue laser light source 70c, the driving current value $I_B$ is determined from the starting drive current storage device 76c (Step S707), the laser drive of the blue laser 71c is carried out with this determined driving current value $I_B$ (Step S708), and the blue laser 71c is controlled by ACC operation (Step S709).

Then, the output powers of the RGB three color lasers 71a to 71c are monitored with respective photo detectors 77a to 77c to confirm the degree of deterioration (the degree of power reduction) of the respective lasers 71a to 71c, the power ratios of three colors stored which are previously stored in the power balancing storage device 79 are referred, and the output powers of the RGB three colors are determined so that the other two lasers are adjusted to the output power of the laser that has most deteriorated among the RGB three lasers 71a to 71c (Step S710). Then, the laser light source which is judged as most having progressed the deterioration is made perform the ACC operation (Step S711, 712), and other two laser light sources are made perform the APC operation with taking power balances with following the output of the deteriorated light sources (Step S713,714).

Thus, the laser light source device 70 of this seventh embodiment is one which makes the respective RGB three color lasers 71a to 71c lighting with the driving current that is learned at the initial time at the start of driving to perform the ACC operation, the output powers then are respectively monitored by the respective photo detectors 77a to 77c to confirm the degree of deterioration (the degree of power reduction) of the respective light sources 71a to 71c, the power ratios of three colors which are previously stored are referred, and the laser powers of the other two colors are adjusted to the power of the laser light source which has the least power for the required power among the three colors, and thereafter, the laser which has most progressed in its deterioration is made perform the ACC operation while the remaining two lasers are made perform the APC operation. Thereby, it is it is possible to suppress the load to the laser light source which is most advancing in its deterioration among the three color laser light source, and it is also possible to lengthen the lifetimes of the RGB three color laser light sources which are essential for the laser image forming device more than before, and thus it is possible to provide images with no color shift for a long period more effectively. Further, since the laser which has most progressed in its deterioration is always under ACC operation in its lighting and there arises no rise in the driving current, it is possible to suppress the progress in the deterioration without applying a load to the laser, being further effective.

Though in the seventh embodiment, while the two lasers having less degree of deterioration perform the APC operation after judging the degree of deterioration, the setting of the upper limit for the driving current during the period from the start of lighting to the un-lighting is not carried out in the APC circuit, the setting of the upper limit for this driving current is preferably carried out so as to provide for the rapid laser deterioration during the APC operation. Thereby, even when the laser is rapidly deteriorated during the APC operation, it is possible to prevent a great deal increase in the driving current and thereby to prevent the rapid destruction of the laser. In addition, it is preferred that when the upper limit driving current value is reached, the laser power control is switched from the APC operation to the ACC operation.

In addition, though the upper limit temperature for the laser chip is not set in the seventh embodiment, it is preferred that the upper limit temperature for the laser chip is provided. Thereby, it is possible to prevent that the driving current would increase with following the temperature rise of the laser chip during the APC operation, thereby preventing the rapid LD deterioration. Here, when the upper limit setting for the driving current is carried out, the value of the driving current is determined within the upper limit range, and there is no necessity to provide the upper limit temperature for the laser chip. However, since increasing the temperature of the laser chip is one of the factors that prevent the lengthening of the lifetimes of lasers, the setting of this upper limit temperature for the laser chip is preferred to be carried out, if possible.

While in the above seventh embodiment a one-chip one-stripe semiconductor laser light source is employed as the RGB three color laser light sources or a excitation light source, a multi-beam laser light source such as a plural-chip semiconductor light source or a multi-stripe semiconductor laser light source may be employed with the similar control methods being applied.

Further, in the seventh embodiment, the wavelengths of the three color lights are constant, and while taking the white balance between the three colors, the power ratio of the three color lasers are controlled as constant. When the wavelength of the laser is varied, the white balance is to be taken with paying considerations on that the power ratios for the power balance is changed. Also when the wavelength changes and the output power changes due to the temperature change of the laser oscillator are generated, the control of the white balance is similarly required.

In the seventh embodiment, since the laser light source which has most advanced in its degree of deterioration is performing an ACC operation, the power during lighting is gradually lowered when observed over a long term. Therefore, it is preferred to carry out the power measurement not only at the start of lighting but also during the lighting, and to occasionally feedback the measured result to the APC operations of the green laser and the blue laser thereby to control the white balance.

Besides, the light sources and the control of the light source device may be realized by the integrated circuit.

The light source according to the present invention can lengthen the lifetime of the laser light sources without employing a photo detector for detecting the deterioration over a long term, and is useful as a light source for a laser image forming device which provides beautiful images without color shift with keeping the output ratio thereof constant.

The invention claimed is:

1. A light source comprising:
a laser oscillator;
a starting drive current storage device for storing a predetermined starting drive current value for said laser oscillator; and
circuitry for controlling said laser oscillator to initiate so as to emit a light at a first start time with a drive current at the predetermined starting drive current value stored in the starting drive current storing device, and thereafter performing constant light output control of said laser oscillator by adjusting the drive current such that the laser oscillator emits light at a constant light output until un-lighting of said laser oscillator, and thereafter controlling said laser oscillator to initiate so as to emit a light at any subsequent start time after the first start time with a drive current at the same predetermined starting drive current value stored in the starting drive current storing device and used for the light emission at the first start time, and thereafter performing constant light output control of said laser oscillator by adjusting the drive current such that the laser oscillator emits light at a constant light output until un-lighting of said laser oscillator.

2. A light source as defined in claim 1, wherein the predetermined starting drive current value stored in the starting drive current storing device is based on a predetermined temperature of the laser oscillator.

3. A light source as defined in claim 2, further comprising a temperature control circuit which controls the temperature of said laser oscillator so that the temperature of said laser oscillator becomes the predetermined temperature.

4. A light source as defined in claim 1, wherein said circuitry halts the constant light output control when the drive current of the laser oscillator has reached a predetermined current value.

5. A light source as defined in claim 1, wherein said circuitry halts the constant light output control when the temperature of the laser oscillator has reached a predetermined temperature.

6. A laser image forming device comprising:
a plurality of said light source device according to claim 1 as each of at least more than two laser light sources, respectively; and
spatial light modulation elements for spatially modulating the output lights from the at least more than two light sources to thereby project the spatially modulated lights onto a screen.

7. A laser image forming device as defined in claim 6, wherein
each of said at least more than two laser sources is an RGB three color light source.

8. A laser image forming device as defined in claim 7, wherein
when the output of one of the RGB three laser light sources is changed, the light outputs from the remaining two laser lights are controlled so as to follow the change in the output power of the one laser light source, thereby to perform a white balancing.

9. A laser image forming device as defined in claim 7, wherein
when the wavelength of one of the RGB three laser light sources is changed, the light outputs from the remaining two laser lights are controlled so as to follow the change in the wavelength of the one laser light source, thereby to perform a white balancing.

* * * * *